United States Patent
Ruesch

(10) Patent No.: US 6,686,765 B2
(45) Date of Patent: Feb. 3, 2004

(54) GTL+ DRIVER

(75) Inventor: Rodney Ruesch, Eau Claire, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 10/210,700

(22) Filed: Jul. 31, 2002

(65) Prior Publication Data

US 2003/0006799 A1 Jan. 9, 2003

Related U.S. Application Data

(62) Division of application No. 09/620,679, filed on Jul. 20, 2000.

(51) Int. Cl.[7] .......................................... H03K 19/0185
(52) U.S. Cl. .............................. 326/30; 326/83; 326/87
(58) Field of Search ............................. 326/26, 27, 30, 326/83, 86, 87

(56) References Cited

U.S. PATENT DOCUMENTS

| | | | | |
|---|---|---|---|---|
| 5,023,488 A | | 6/1991 | Gunning ..................... 307/475 |
| 5,337,254 A | * | 8/1994 | Knee et al. .................... 716/1 |
| 5,483,188 A | | 1/1996 | Frodsham ................... 327/170 |
| 5,598,119 A | | 1/1997 | Thayer et al. .............. 327/111 |
| 5,661,415 A | | 8/1997 | Aoki et al. ................... 326/82 |
| 5,701,331 A | | 12/1997 | Hunt ........................... 375/316 |
| 5,781,050 A | | 7/1998 | Russell ....................... 327/170 |
| 5,852,372 A | | 12/1998 | Boeckmann et al. ......... 326/83 |
| 5,889,419 A | | 3/1999 | Fischer et al. ................ 327/70 |
| 5,940,448 A | | 8/1999 | Kuo ............................ 375/316 |
| 5,966,032 A | | 10/1999 | Elrabaa et al. ................ 326/84 |
| 5,973,515 A | | 10/1999 | Marbot et al. ................ 327/65 |
| 6,040,732 A | | 3/2000 | Brokaw ....................... 327/408 |
| 6,051,995 A | | 4/2000 | Pollachek ...................... 326/87 |
| 6,060,907 A | | 5/2000 | Vishwanthaiah et al. ..... 326/87 |
| 6,078,978 A | | 6/2000 | Suh ............................. 710/129 |
| 6,118,310 A | | 9/2000 | Esch, Jr. ...................... 327/108 |
| 6,160,423 A | | 12/2000 | Haq ............................. 327/41 |
| 6,184,717 B1 | | 2/2001 | Crick ........................... 326/86 |
| 6,222,389 B1 | * | 4/2001 | Williams ...................... 326/86 |
| 6,326,821 B1 | * | 12/2001 | Gabara ........................ 327/112 |
| 6,366,139 B1 | * | 4/2002 | Ang et al. .................... 327/108 |
| 6,509,757 B1 | * | 1/2003 | Humphrey .................... 326/30 |
| 2002/0118037 A1 | * | 8/2002 | Kim et al. ..................... 326/30 |

* cited by examiner

*Primary Examiner*—Don Le
(74) *Attorney, Agent, or Firm*—Schwegman, Lundberg, Woessner & Kluth, P.A.

(57) ABSTRACT

A driver operable with two power supplies, and provides, among other things, a high data communication rate, stabilized operating parameters including voltage output high, voltage output low, and on resistance, and edge rate over a wide range of variations in manufacturing process, operating voltages and temperature.

21 Claims, 19 Drawing Sheets

SELECTABLE OP RESISTORS TO BE USED WITH PADXFER METAL (LM) TOTAL RESISTANT MATCHING UP TO 3 OHMS

ONE RESISTOR L=2.1U AND W=93.0U = 3.0 OHMS
ONE RESISTOR L=2.1U AND W=111.0U = 2.5 OHMS
ONE RESISTOR L=2.1U AND W=139.0U = 2.0 OHMS
ONE RESISTOR L=2.1U AND W=185.0U = 1.5 OHMS
ONE RESISTOR L=2.1U AND W=278.0U = 1.0 OHMS
TWO RESISTORS L=2.1U AND W=278.0U IN PARALLEL = 0.5 OHMS SHOWN
ZERO RESISTORS TO BE USED FOR 0 OHMS

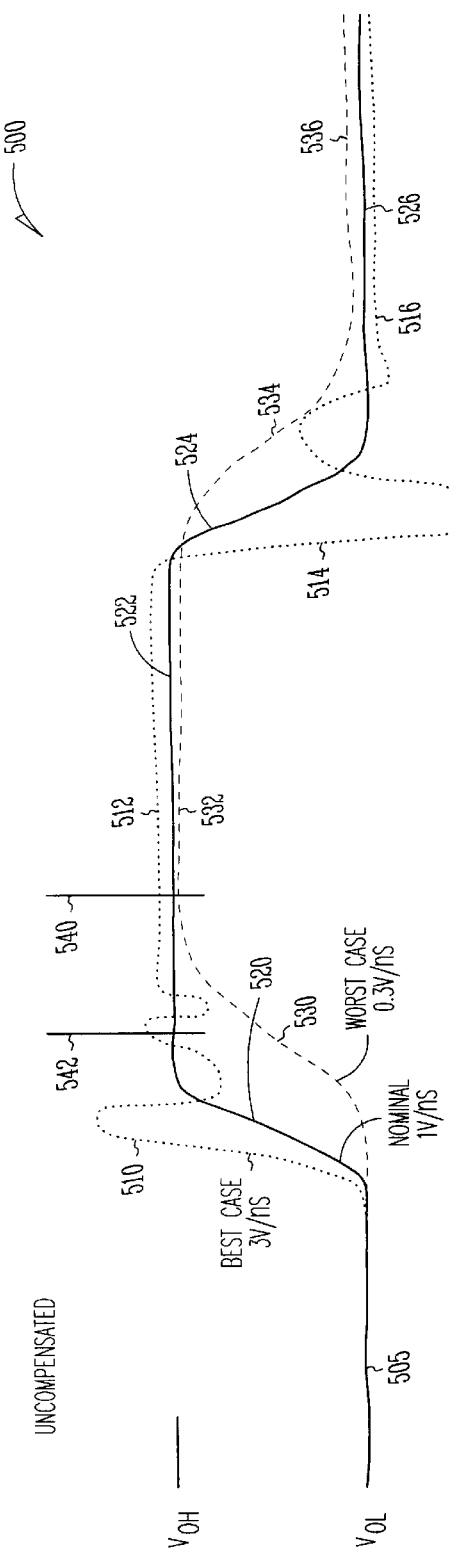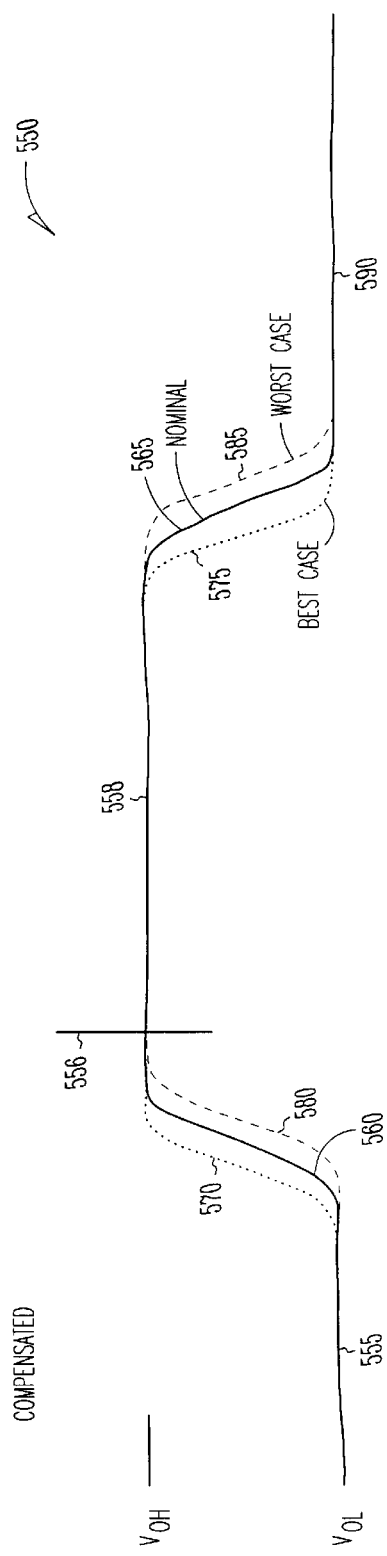
Fig.9A
Fig.9B

DESCRIPTION:
NON-INVERTING BI-DIRECTIONAL DRIVER/RECEIVER THAT INTERFACES 1.8V INTERNAL FUNCTIONS WITH 1.1V ENHANCED GTL+ OFF-CHIP BI-DIRECTIONAL DATA BUS. THE DRIVER OPERATES WITH A 1.8V SUPPLY. THE DRIVER HAS OFF-CHIP TERMINATION OF 45 OHM TO 1.1V ($V_{TT}$) AT EACH END OF THE BUS (DOUBLE TERMINATION). THE RECEIVER HAS EXTERNAL REFERENCE Vref ($V_{TT}*2/3$).

| | |
|---|---|
| A0 | DRIVER DATA0 INPUT |
| A1 | DRIVER DATA1 INPUT |
| AN0 | DRIVER DATA0 INPUT |
| AN1 | DRIVER DATA1 INPUT |
| SA | DRIVER DATA SELECT INPUT |
| DI | DRIVER INHIBIT INPUT (DI IN) |
| TS | IN-PHASE DRIVER THREE-STATE CONTROL |
| TSN | OUT-PHASE DRIVER THREE-STATE CONTROL |
| PVTP[8:0] | PMOS EDGE RATE CONTROL BUS INPUT |
| PVTN[8:0] | NMOS IMPEDANCE CONTROL BUS INPUT |
| RE | REFERENCE ENABLE |
| RI | RECEIVER INHIBIT INPUT (RI IN) |
| VREF | (Vtt*2/3) INPUT SIGNAL |
| PAD | IN-PHASE DRIVER OUTPUT/RECEIVER INPUT |
| PADN | OUT-PHASE DRIVER OUTPUT/RECEIVER INPUT |
| ZDI | DRIVER INHIBIT OUTPUT (DI OUT) |
| ZRI | RECEIVER INHIBIT OUTPUT (RI OUT) |
| Z | IN-PHASE RECEIVER OUTPUT |
| ZN | OUT-PHASE RECEIVER OUTPUT |
| ZA | DATA0 TEST OUTPUT (A0 OR A1 OUT) |
| ZAN | DATAN0 TEST OUTPUT (AN0 OR AN1 OUT) |
| ZBSR | PAD TEST OUTPUT (PAD OUT) |
| ZNBSR | PADN TEST OUTPUT (PADN OUT) |
| LT | LEAKAGE TEST INPUT |

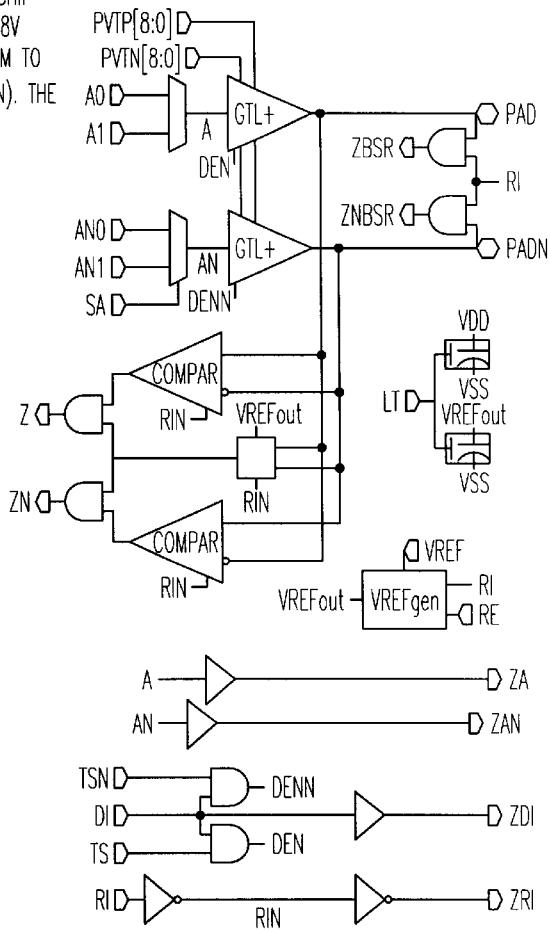

Fig.10

DRIVER TRUTH TABLE

| INPUTS | | | | | PVTP | PVTN | OUTPUTS | |
|---|---|---|---|---|---|---|---|---|
| A0 | A1 | SA | TS | DI | | | PAD | COMMENTS |
| - | - | - | 0 | - | - | - | HI-Z¹ | HIGH IMPEDANCE MODE |
| - | - | - | - | 0 | - | - | HI-Z¹ | HIGH IMPEDANCE MODE |
| 0 | - | - | - | - | 0² | 0² | HI-Z¹ | PVT TEST MODE |
| 1 | - | - | - | - | - | 0² | HI-Z¹ | PVT TEST MODE |
| 0 | - | - | 1 | 1 | 0² | - | HI-Z¹ | PVT TEST MODE |
| 1 | - | 0 | 1 | 1 | - | >0 | 0³ | PVT TEST MODE³ |
| 0 | - | 0 | 1 | 1 | >0 | - | 1³ | PVT TEST MODE³ |
| 0 | - | 0 | 1 | 1 | >0 | >0 | 0³ | FUNCTIONAL, A0 DATA MODE |
| 0 | - | 0 | 1 | 1 | 1 | 1 | 0³ | FUNCTIONAL, 10 OHMS @ BC |
| 0 | - | 0 | 1 | 1 | 4 | 4 | 0³ | FUNCTIONAL, 10 OHMS @ NOM |
| 0 | - | 0 | 1 | 1 | 8 | 8 | 0³ | FUNCTIONAL, 10 OHMS @ WC |
| 1 | - | 0 | 1 | 1 | >0 | >0 | 1³ | FUNCTIONAL, A0 DATA MODE |
| - | 1 | 1 | 1 | 1 | >0 | >0 | A1 | FUNCTIONAL, A1 DATA MODE |

1. PAD IS AT "$V_{TT}$" WHEN CONNECTED TO OFF-CHIP TERMINATOR.
2. WHEN PVT=0 ALL PVT BITS GO TO $V_{SS}$ AND ARE OFF.
3. PAD LOGICAL "1"=Vtt=1.1V, LOGICAL "0"=0.4V OR LESS.

NOTES: A. Vdd=1.8(+/-0.1)V, Vtt=1.1(+/-0.02)V
B. DURING MODULE EXTERNAL I/O TEST AND SYSTEM MODE, DRIVER OUTPUT PULLUP IS MADE BY THE EXTERNAL 22.5 OHM RESISTOR TO Vtt.
C. NDR WILL BE BASED ON DRIVER TERMINATED OFF-CHIP.
D. A0, A1, AN0, AND AN1 ARE INDEPENDENT FROM EACH OTHER.
E. ENTRIES IN COLUMNS PVTP, PVTN REPRESENT NUMBER OF LINES HELD AT LOGIC "1" STATE. FOR TESTING, THE IMPEDANCE CONTROLLER FORCES PVTP AND PVTN TO 4 (i.e. PVTP[8:0]=PVTN[8:0]=[000011110]) FOR ALL SUPPLY VOLTAGE LEVELS.

Fig. 12

DRIVER TRUTH TABLE

| INPUTS | | | | | | | OUTPUTS | |
|---|---|---|---|---|---|---|---|---|
| AN0 | AN1 | SA | TSN | DI | PVTP | PVTN | PADN | COMMENTS |
| - | - | - | - | - | - | - | Hi-Z¹ | HIGH IMPEDANCE MODE |
| - | - | - | - | 0 | - | - | Hi-Z¹ | HIGH IMPEDANCE MODE |
| - | - | - | - | - | 0² | 0² | Hi-Z¹ | PVT TEST MODE |
| 0 | - | 0 | - | - | - | 0² | Hi-Z¹ | PVT TEST MODE |
| 1 | - | 0 | - | - | 0² | - | Hi-Z¹ | PVT TEST MODE |
| 0 | - | 0 | 1 | 1 | - | >0 | 0³ | PVT TEST MODE³ |
| 1 | - | 0 | 1 | 1 | >0 | - | 1³ | PVT TEST MODE³ |
| 0 | - | 0 | 1 | 1 | 1 | 1 | 0³ | FUNCTIONAL, A0 DATA MODE |
| 0 | - | 0 | 1 | 1 | 4 | 4 | 0³ | FUNCTIONAL, 10 OHMS @ BC |
| 0 | - | 0 | 1 | 1 | 8 | 8 | 0³ | FUNCTIONAL, 10 OHMS @ NOM |
| 0 | - | 1 | 1 | 1 | >0 | >0 | 1³ | FUNCTIONAL, 10 OHMS @ WC |
| 1 | - | 0 | 1 | 1 | >0 | >0 | 0³ | FUNCTIONAL, A0 DATA MODE |
| - | - | - | 1 | 1 | >0 | >0 | A1 | FUNCTIONAL, A1 DATA MODE |

1. PAD IS AT "V$_{TT}$" WHEN CONNECTED TO OFF-CHIP TERMINATOR.
2. WHEN PVT=0 ALL PVT BITS GO TO V$_{SS}$ AND ARE OFF.
3. PAD LOGICAL "1"=Vtt=1.1V, LOGICAL "0"=0.4V OR LESS.

NOTES:
A. Vdd=1.8(+/-0.1)V, Vtt=1.1(+/-0.02)V
B. DURING MODULE EXTERNAL I/O TEST AND SYSTEM MODE, DRIVER OUTPUT PULLUP IS MADE BY THE EXTERNAL 22.5 OHM RESISTOR TO Vtt.
C. NDR WILL BE BASED ON DRIVER TERMINATED OFF-CHIP.
D. A0, A1, AN0, AND AN1 ARE INDEPENDENT FROM EACH OTHER.
E. ENTRIES IN COLUMNS PVTP, PVTN REPRESENT NUMBER OF LINES HELD AT LOGIC "1" STATE. FOR TESTING, THE IMPEDANCE CONTROLLER FORCES PVTP AND PVTN TO 4 (i.e. PVTP[8:0]=PVTN[8:0]=[000011110]) FOR ALL SUPPLY VOLTAGE LEVELS.

Fig.13

DRIVER PROPAGATION DELAYS (NO LOAD ON OUTPUTS)

| PATH (INPUT TO OUTPUT) | PERFORMANCE LEVEL | PARAMETER | DELAY (ns)=INTERCEPT+SLOPE (D$_{std}$)[1] | | |
|---|---|---|---|---|---|
| | | | V$_{dd}$=1.72V<br>V$_{tt}$=1.08V<br>T$_j$=100°C<br>PROCESS=SLOW | V$_{dd}$=1.8V<br>V$_{tt}$=1.13V<br>T$_j$=60°C<br>PROCESS=NOM. | V$_{dd}$=1.92V<br>V$_{tt}$=1.12V<br>T$_j$=25°C<br>PROCESS=FAST |
| A0-PAD | A | t$_{PLH}$ | 1.2ns | 1.0ns | 0.8ns |
| | | t$_{PHL}$ | 1.2ns | 1.0ns | 0.8ns |
| AN0-PADN | A | t$_{PLH}$ | 1.2ns | 1.0ns | 0.8ns |
| | | t$_{PHL}$ | 1.2ns | 1.0ns | 0.8ns |

1. D$_{std}$ IS THE NUMBER OF STANDARD LOADS.
2. VOLTAGE AT THE PACKAGE PIN.
3. DESIGN IS OPTIMIZED FOR Vtt=1.1V, CAN BE USED FOR Vtt=1.0V TO 1.2V.

Fig.14

GTL+ DRIVER

RELATED APPLICATIONS

The application is a continuation of U.S. patent application Ser. No. 09/620,679, filed Jul. 20, 2000, entitled GTL+ DRIVER.

TECHNICAL FIELD OF THE INVENTION

The present invention relates generally to data communications between electronic devices and particularly, but not by way of limitation, to a driver for high speed data communications.

BACKGROUND

Of the many trends apparent in the electronic industry, two noteworthy examples include increased processor speeds and reduced power consumption. The trend toward increased processor speed enables execution of sophisticated and complex calculations at ever increasing speeds. Commensurate with an increased speed is the reduced time available in which digital data may be transmitted and received. The trend toward reduced power consumption facilitates devices operable with battery power or other means having a reduced power supply capacity. Also, low power devices dissipate less heat which further enables a higher component density and yet provide reliable operation.

The limited amount of available space on an integrated circuit often constrains the placement of components, including such circuits as drivers. A driver circuit is used to receive an input signal and provides an output signal on interconnect lines. In many applications, a driver requires connections to multiple power supplies. For example, power supply traces often are not available or are unduly problematic.

For efficiency reasons, the output impedance of a driver should be matched to the load of the interconnect lines. Manufacturing tolerances associated with the production of driver circuits may yield some drivers more closely matched than other drivers. In addition, variations in voltage levels can be problematic in the pursuit of high speed reliable data communications. For example, high voltages may result in very fast slew rates and thus lead to excessive current drain during such rapid swings. Ringing of the output voltage levels following level transitions may further delay the sensing of a level. Temperature changes can also have deleterious effects. For example, excessive operating temperature, such as may result from a suboptimal cooling fan, can degrade driver circuit performance and further limit reliable clock speeds, or lead to processing errors.

What is needed in the art is a driver having low power requirements which is reliably operable at a high data communication rate with compensation for variations in process, voltage and temperature.

SUMMARY

The above mentioned problems associated with driver systems, and other problems, are addressed by the present invention and will be understood by reading and studying the following specification.

In particular, an illustrative embodiment of the present invention includes an integrated circuit driver having an output node for coupling to a load and providing a first and second voltage level at a predetermined impedance. The first and second voltage level correspond to a logic high and logic low level, respectively. The output node also provides a high impedance state. The driver includes a first switched resistive element coupled to the output node and also coupled to a first voltage source, a second switched resistive element coupled to the output node and also coupled to a second voltage source and a third switched resistive element coupled to the output node and also coupled to the second voltage source. The first switched resistive element is actuated by a first control line coupled to the first switched resistive element. The second switched resistive element is actuated by a second control line coupled to the second switched resistive element. The third switched resistive element is actuated by a third control line coupled to the third switched resistive element. The load is a resistive load coupled to a third voltage source. The first voltage level, the second voltage level and the predetermined impedance remain substantially constant with variations in manufacturing process, variations in the first voltage source, variations in the second voltage source and variations in operating temperature.

In one embodiment, the first switched resistive element includes a PFET. In one embodiment, the second switched resistive element comprises an NFET. In one embodiment, the third switched resistive element comprises an NFET. In one embodiment, the ratio of the resistance of the second switched resistive element to the resistance of the third switched resistive element is approximately five to one. In one embodiment, the first voltage source is approximately 1.8 volts.

One illustrative embodiment of the present invention includes a method including receiving a data signal, adjusting a first resistance coupled to a first supply voltage, based on a manufacturing process, the first supply voltage and a temperature, adjusting a second resistance coupled to a second supply voltage, based on the manufacturing process, the first supply voltage and the temperature and adjusting a third resistance coupled to the second supply voltage, based on the manufacturing process, the first supply voltage and the temperature.

One illustrative embodiment of the present invention includes a method including selecting a resistance of a divider network based on a manufacturing process, a supply voltage and a temperature, selecting an edge rate of a driver coupled to the divider network, the selected edge rate based on the manufacturing process, the supply voltage and the temperature, receiving a data signal and providing an output based on the data signal, the resistance, and the edge rate. In one embodiment, selecting an edge rate of a driver coupled to the divider network includes maintaining a substantially constant edge rate. In one embodiment, providing an output includes turning on a PFET transistor and turning off an NFET transistor. In one embodiment, selecting a resistance of a divider network includes selecting a plurality of parallel resistance elements. In one embodiment, selecting a resistance of a divider network comprises executing programming for selecting resistance elements from a plurality of switchable resistance elements. In one embodiment, selecting an edge rate of a driver coupled to the divider network comprises selecting a plurality of parallel resistance elements. In one embodiment, selecting an edge rate of a driver coupled to the divider network comprises executing programming for selecting resistance elements from a plurality of switchable resistance elements. One embodiment includes receiving a tristate enable signal and actuating a switchable resistance element in response to the tristate enable signal. In one embodiment, actuating a switchable resistance element comprises actuating a programmable inverter.

One illustrative embodiment of the present invention includes a driver having an output section, a first predriver section and a second predriver section. The output section includes an output node, a plurality of P-nodes, a first plurality of P-channel transistors, a plurality of N-nodes, a first plurality of N-channel transistors and a second plurality of N-channel transistors. Each P-channel transistor of the first plurality of P-channel transistors has a source coupled to a supply voltage and a drain coupled to the output node, wherein each of the plurality of P-nodes is coupled to a gate of each P-channel transistor of the first plurality of P-channel transistors. Each N-channel transistor of the first plurality of N-channel transistors has a drain coupled to the output node and a source coupled to a ground potential relative to the supply voltage wherein each of the plurality of N-nodes is coupled to a gate of each N-channel transistor of the first plurality of N-channel transistors. Each N-channel transistor of the second plurality of N-channel transistors has a drain coupled to the output node and a source coupled to the ground potential wherein each of the plurality of N-nodes is coupled to a gate of each N-channel transistor of the second plurality of N-channel transistors. The first predriver section includes a P-output node, a second plurality of P-channel transistors, a third plurality of N-channel transistors, an N-output node, a third plurality of P-channel transistors and a fourth plurality of N-channel transistors. Each P-channel transistor of the second plurality of P-channel transistors has a source coupled to the supply voltage and a drain coupled to the P-output node, wherein each of the plurality of P-nodes is coupled to a gate of each P-channel transistor of the second plurality of P-channel transistors. Each N-channel transistor of the third plurality of N-channel transistors has a drain coupled to the P-output node and a source coupled to the ground potential and wherein each of the plurality of N-nodes is coupled to a gate of each N-channel transistor of the third plurality of N-channel transistors. Each P-channel transistor of the third plurality of P-channel transistors has a source coupled to the supply voltage and a drain coupled to the N-output node, wherein each of the plurality of P-nodes is coupled to a gate of each P-channel transistor of the third plurality of P-channel transistors. Each N-channel transistor of the fourth plurality of N-channel transistors has a drain coupled to the N-output node and a source coupled to the ground potential and wherein each of the plurality of N-nodes is coupled to a gate of each N-channel transistor of the fourth plurality of N-channel transistors. The P-output node is coupled to the source of each P-channel transistor of the first plurality of P-channel transistors and the N-output node is coupled to the source of each N-channel transistor of the first plurality of N-channel transistors. The second predriver section includes a T-node, a fourth plurality of P-channel transistors, and a fifth plurality of N-channel transistors. Each P-channel transistor of the fourth plurality of P-channel transistors has a source coupled to the supply voltage and a drain coupled to the T-node, wherein each of the plurality of P-nodes is coupled to a gate of each P-channel transistor of the fourth plurality of P-channel transistors. Each N-channel transistor of the fifth plurality of N-channel transistors has a drain coupled to the T-node and a source coupled to the ground potential and wherein each of the plurality of N-nodes is coupled to a gate of each N-channel transistor of the fifth plurality of N-channel transistors. The T-node is coupled to the source of each of the second plurality of N-channel transistors of the output section.

In one embodiment, the P-channel transistors are PFET transistors and the N-channel transistors are NFET transistors. In one embodiment, the first plurality of P-channel transistors includes one P-channel transistor having an effective resistance lower than an effective resistance of each of the other P-channel transistors in the first plurality of P-channel transistors. In one embodiment, the first plurality of N-channel transistors includes one N-channel transistor having an effective resistance lower than an effective resistance of each of the other N-channel transistors in the first plurality of N-channel transistors. In one embodiment, the second plurality of N-channel transistors includes one N-channel transistor having an effective resistance lower than an effective resistance of each of the other N-channel transistors in the second plurality of N-channel transistors. In one embodiment, the ratio of the effective resistance of the second plurality of N-channel transistors to the effective resistance of the first plurality of N-channel transistors is approximately five to one.

BRIEF DESCRIPTION OF THE DRAWINGS

In the drawings, like numerals describe substantially similar components throughout the several views, with alphabetic suffixes indicating different instances of similar components.

FIGS. 9A and 9B illustrate generally performance of a driver.

FIG. 10 illustrates a model of one embodiment of the present system.

FIG. 12 tabulates a truth table for portions of one embodiment of the present system.

FIG. 13 tabulates a truth table for portions of one embodiment of the present system.

FIG. 14 tabulates propagation delays for a portion of one embodiment of the present system.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
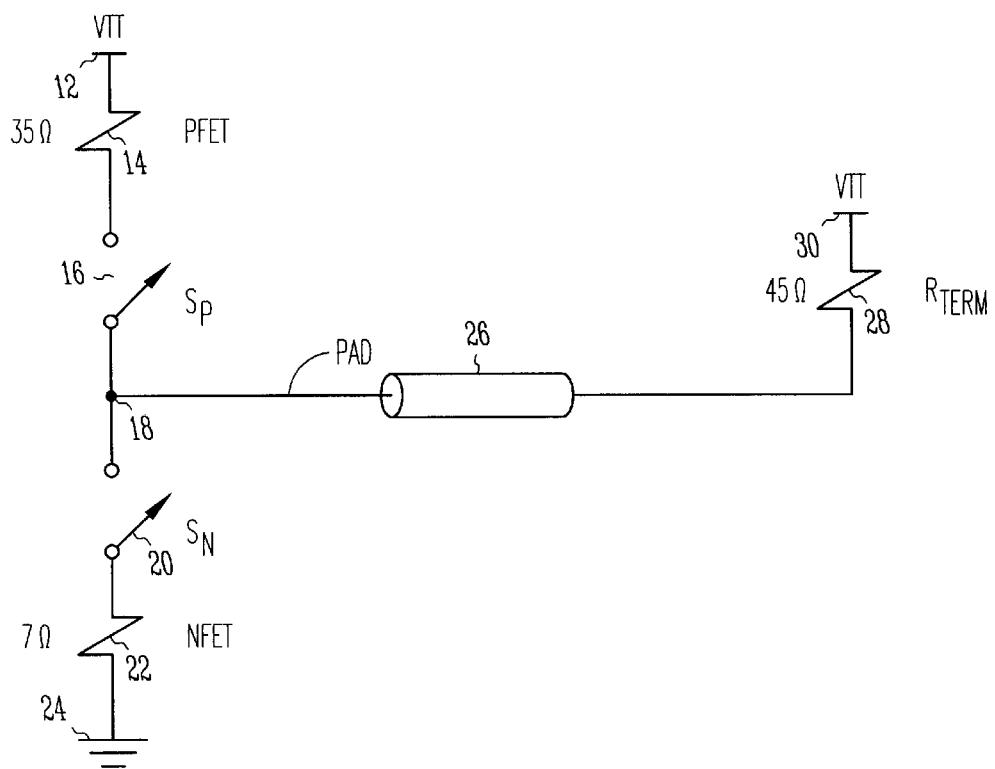
FIG. 1 is a schematic diagram illustrating generally an output driver coupled to a transmission line.

FIG. 1 depicts a schematic showing driver circuit 10. Driver circuit 10 is shown coupled to transmission line 26 terminating at load resistor 28, herein denoted as $R_{TERM}$. A typical value for $R_{TERM}$ is 45 ohms. Transmission line 26 may be an interconnect bus. The other leg of resistor 28 is coupled to supply voltage 30, herein marked $V_{TT}$.

Driver circuit 10 may employ GTL technology as described in U.S. Pat. No. 5,023,488 to William F. Gunning, which is herein incorporated by reference. The +− symbol of GTL+ denotes the use of a PFET pull up transistor coupled to the drain of the NFET pull down transistor at the output of the driver.

Driver circuit 10 is depicted herein as modeled by a pair of switched resistors. A first end of one leg of the driver circuit is coupled to supply voltage 12. In the figure, voltage 12 corresponds to $V_{TT}$. Continuing with the model, the first leg of driver circuit 10 includes resistor 14 and switch 16. As noted in the figure, resistor 14 and switch 16 correspond to a PFET transistor. A second leg of driver circuit 10 includes series connected switch 20 and resistor 22. Also as noted in the figure, switch 20 and resistor 22 correspond to an NFET transistor. The output node of driver circuit 10 is denoted by numeral 18 and is coupled to transmission line 26.

Table 1 represents the operation of driver circuit 10. In the table, $S_P$ corresponds to switch 16, $S_N$ corresponds to switch 20, Pad corresponds to the electrical level of the output node 18 and State corresponds to the logical state of the output node 18. Referring to the first line of data in Table 1, when $S_P$ is open (denoted herein by table entry 0) and $S_N$ is open, Pad will be at a voltage level of $V_{TT}$. In this condition, driver circuit 10 presents a high impedance (Z) state, also known as tristate. While in tristate condition, no current flows on output node 18. In the tristate condition, other circuitry not shown in FIG. 1, and also coupled to transmission line 26, may communicate digital data. Referring to the second line of data in Table 1, when $S_P$ is closed (denoted herein by table entry 1) and $S_N$ is open, Pad attains a voltage level known as $V_{OH}$, voltage output high, approaching that of $V_{TT}$, and will be interpreted as denoting a logic level 1. Referring to the third line of data in Table 1, when $S_P$ is open and $S_N$ is closed, Pad drops to a voltage level referred to herein as $V_{OL}$, or voltage output low, corresponding to logic level 0. A typical value for $V_{OL}$ is 350 millivolts. $V_{OL}$ and $V_{OH}$ are determined as a function of the resistance of the elements of the driver.

TABLE 1

| $S_P$ | $S_N$ | Pad | State |
|---|---|---|---|
| 0 | 0 | $V_{TT}$ | High Z |
| 1 | 0 | $V_{OH}$ | logic "1" |
| 0 | 1 | $V_{OL}$ | logic "0" |

A typical constraint arising in integrated circuit design concerns the availability of power supply sources within a particular quadrant. Power supply lines often conduct relatively high current levels, and thus can have undesirable effects on adjacent circuit elements. In addition, power supply lines often require large areas of an integrated circuit. Therefore, minimizing the area occupied by power supply lines on an integrated circuit can be advantageous.

The supply voltage levels in a GTL+ circuit are offset and thus implementation calls for a separate power supply. In one embodiment of the present system, a separate power supply is replaced by a circuit modeled in the manner of a Thevinized power supply, namely, an ideal voltage source in series with an ideal resistor.

Figure 2A:
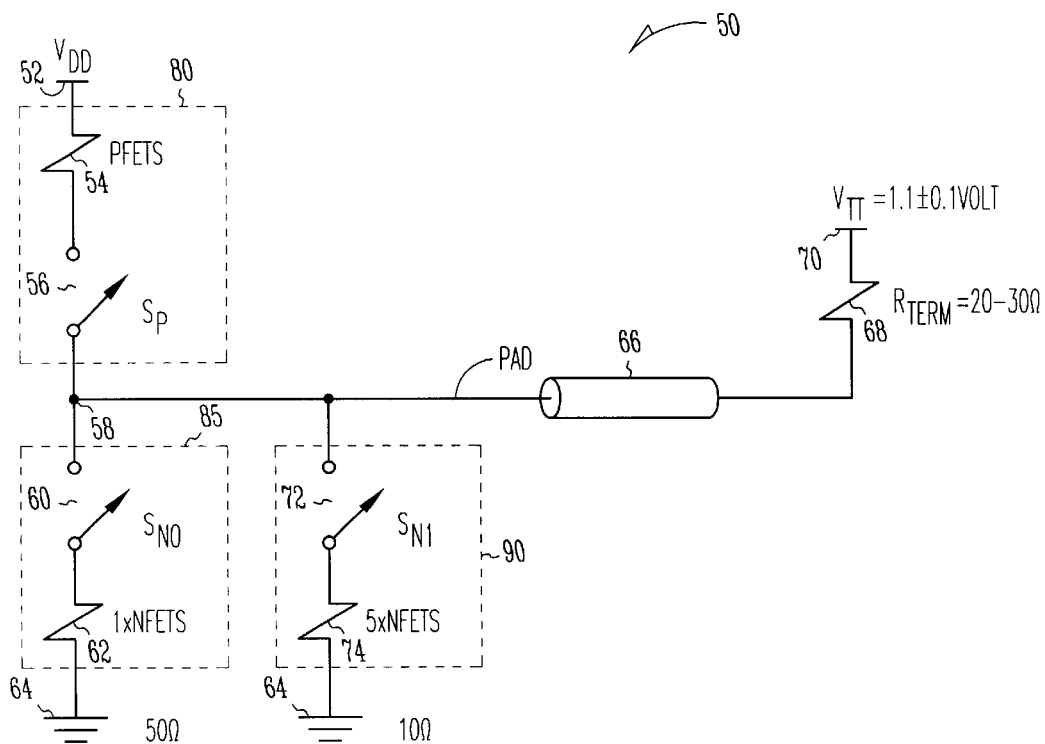
FIG. 2A is a schematic diagram illustrating generally a portion of the present system and the environment in which it operates.

FIG. 2A depicts one embodiment of the subject matter of present system 50. In one embodiment, the driver of system 50 is suitable for operation in conjunction with a receiver, or detector, as described in an application for patent entitled GTL+ONE-ONE/ZERO-ZERO DETECTOR, filed Jul. 20, 2000, bearing Ser. No. 09/621,312, attorney docket number 499.076US1, inventor Rodney Ruesch and assigned to the assignee in the instant application, which application is hereby incorporated by reference in its entirety.

In system 50, supply voltage 52 is denoted $V_{DD}$. In one embodiment, $V_{DD}$ is specified as 1.8 volts nominal. Coupled to $V_{DD}$ is resistor 54 in series with switch 56. At a time when switch 56 is closed, resistor 54 may be said to pull up the voltage of output node 58. Node 58, denoted herein as Pad, is coupled to transmission line 66.

In this instance, the term Pad refers to an output connection terminal. In one embodiment, Pad provides coupling of the driver to other circuits. The other circuits may be collocated on the same integrated circuit or on other integrated circuits or other devices.

Transmission line 66 may be an interconnect circuit or strip line trace having a particular characteristic impedance. Driver 50 is coupled to transmission line 66 and for efficient energy conductance, the output resistance of driver 50 should be matched by the characteristic impedance of transmission line 66. In one embodiment, transmission line 66 has an impedance in the range of 40 to 60 ohms, with a typical value of 27.5 ohms. The 27.5 ohms typical value of $R_{TERM}$ 68 represents a nominal impedance. In FIG. 2A, $R_{TERM}$ 68 is denoted as having a resistance value of 20 to 30 ohms.

Transmission line 66 may be double terminated, that is, having a series resistance of 45 ohms at each end and coupled to a nominal termination voltage denoted $V_{TT}$. Nominal termination voltage $V_{TT}$ is a power supply providing a voltage lower than $V_{DD}$, and in one embodiment, $V_{TT}$ is 1.1±0.1 volts.

A second leg of driver 50, also is coupled to node 58 and includes a series connection of switch 60 and resistance 62 coupled to ground 64. Switch 60 corresponds to $S_{N0}$ in FIG. 2A. In one embodiment, resistance 62 corresponds to the on resistance of an NFET transistor. A third leg of driver 50, also coupled to node 58, includes a series connection of switch 72 and resistance 74 coupled to ground 64. Switch 72 corresponds to $S_{N1}$ in FIG. 2A. In one embodiment, resistance 74 corresponds to the on resistance of an NFET transistor.

Operation of driver 50 of FIG. 2A is presented in Table 2. In the table, $S_P$ corresponds to switch 56, $S_{N0}$ corresponds to switch 60, $S_{N1}$ corresponds to switch 72, Pad corresponds to the electrical level of the output node 58, and State corresponds to the logical state of the output node 58. Referring to the first line of data in Table 2, when $S_P$, $S_{N0}$, and $S_{N1}$ are all in an open condition, Pad will be at a voltage level of $V_{TT}$ and driver circuit 50 is in tristate mode. Referring to the second line of data in Table 2, when $S_P$ and $S_{N0}$ are closed and $S_{N1}$ is open, Pad attains a voltage of $V_{OH}$ and will be interpreted as denoting a logic level 1. Referring to the third line of data in Table 2, when $S_P$ is open and both $S_{N0}$ and $S_{N1}$ are both closed, Pad drops to a voltage of $V_{OL}$ corresponding to logic level 0. It will be noted that $S_{N0}$ is on during binary states of logic 1 and logic 0 and $S_{N0}$ is off in tristate mode.

TABLE 2

| $S_P$ | $S_{N0}$ | $S_{N1}$ | Pad | State |
|---|---|---|---|---|
| 0 | 0 | 0 | $V_{TT}$ | High Z |
| 1 | 1 | 0 | $V_{OH}$ | logic "1" |
| 0 | 1 | 1 | $V_{OL}$ | logic "0" |

Figure 2B:
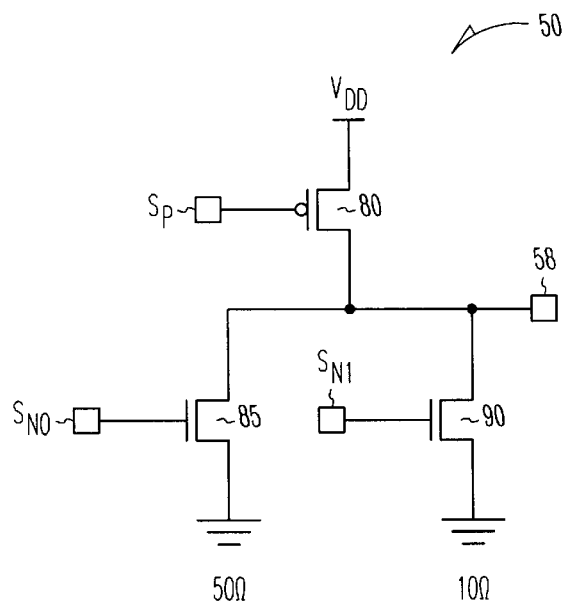
FIG. 2B is a schematic diagram illustrating generally a portion of the present system.

FIG. 2B illustrates another model of one embodiment of driver 50. In the figure, PFET 80 is depicted as having a source coupled to $V_{DD}$, a drain coupled to output node 58, and a gate coupled to terminal $S_P$. PFET 80 is represented in FIG. 2A by means of a dashed box. In one embodiment, driver 50 also includes NFET 85 having a source coupled to ground, a drain coupled to output node 58, and a gate coupled to terminal $S_{N0}$. NFET 85 is represented in FIG. 2A by means of a dashed box. In one embodiment, driver 50 includes NFET 90 also having a source coupled to ground, a drain coupled to output node 58, and a gate coupled to terminal $S_{N1}$. NFET 90 is represented in FIG. 2A by means of a dashed box. PFET 80 pulls the voltage on node 58 upward and NFET 85 and NFET 90 both pull the voltage on node 58 downward. In the tristate mode, NFET 85 is turned off and when not in tristate, NFET 85 remains on.

In one embodiment, selection of the on resistance for PFET 80, NFET 85 and NFET 90 for a given value of $V_{DD}$ yields the desired output voltage levels $V_{OL}$ and $V_{OH}$ at node 58 as well as the output resistance at node 58. In one embodiment, PFET 80 is selected to provide a nominal resistance of 35 ohms, NFET 85 is selected to provide a nominal resistance of 50 ohms and NFET 90 is selected to provide a nominal resistance of 10 ohms. Such a combination of resistance values is suitable for efficient energy transfer from driver 50 to a load on a transmission line having a nominal resistance of 27.5 ohms. In one embodiment, the desired resistance levels for PFET 80, NFET 85 and NFET 90 is achieved by adjusting the physical dimensions of the transistor regions in an integrated circuit. In one embodiment, the width of NFET 90 is five times larger than the width of NFET 85, and thus, the resistance of NFET 90 is one fifth that of the resistance of NFET 85. In one embodiment, NFET 90 is 67 microns wide and NFET 85 is 13.5 microns wide. In one embodiment, multiple transistors are connected in parallel to achieve the desired resistance. In one embodiment, NFET 90 is 15 copies of a particular transistor, with each transistor 4.5 microns wide and NFET 85 is 3 copies of the same particular transistor.

Figure 3:
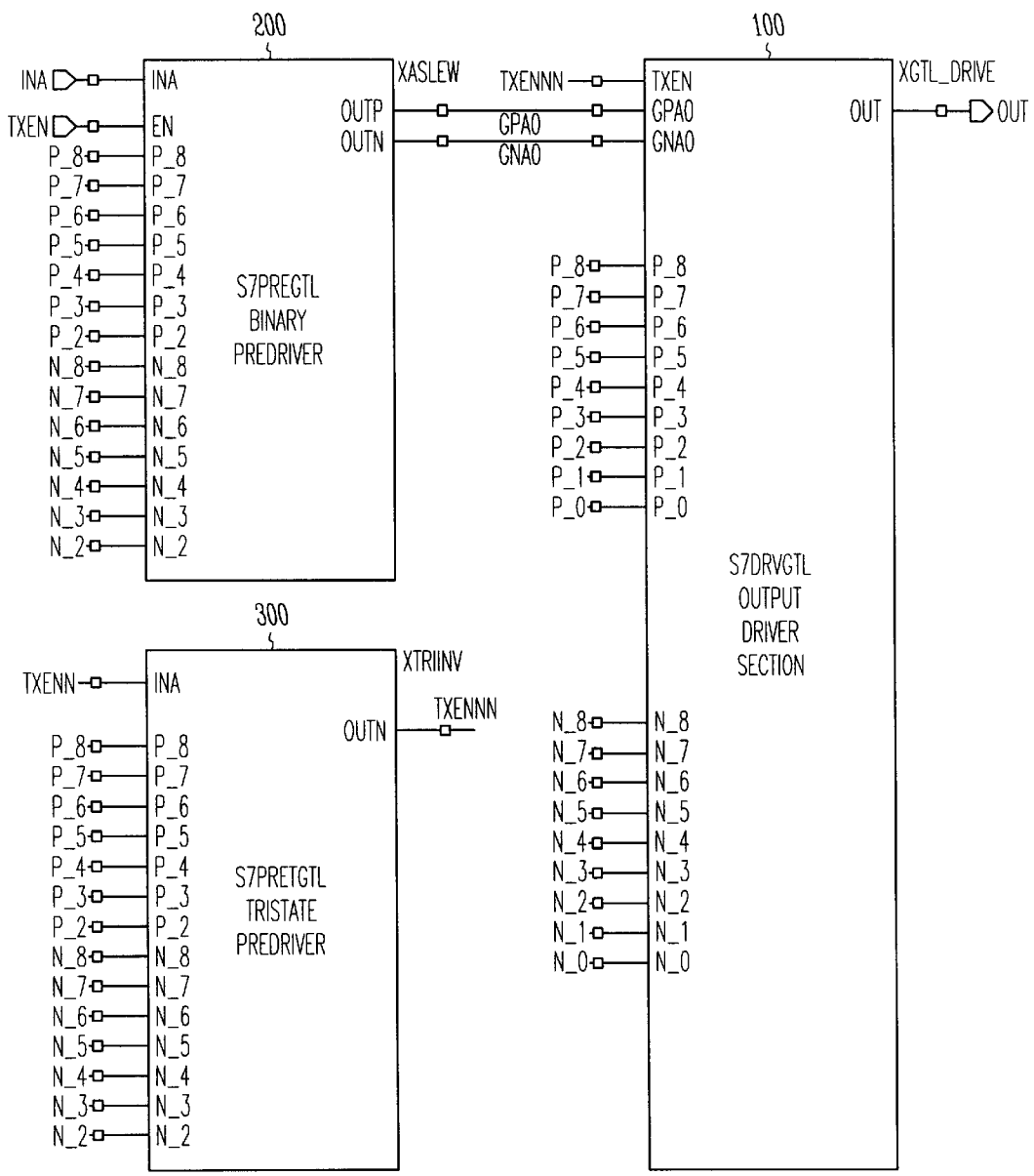
FIG. 3 illustrates a modular representation of one embodiment of a portion of the present system.

In one embodiment, driver 50 is modified to compensate for variations in process, voltage and temperature. FIG. 3 illustrates a modular representation of one embodiment of a portion of the present system having a compensation system.

In the embodiment illustrated in FIG. 3, three modules are interconnected. Module 100, also known as output driver section, includes an OUT terminal which corresponds to node 58 in FIG. 2B. Module 100 also includes a plurality of nodes, or terminals, labeled P_0, P_1, P_2, P_3, P_4, P_5, P_6, P_7 and P_8 and N_0, N_1, N_2, N_3, N_4, N_5, N_6, N_7 and N_8. Module 100 includes terminals TXEN, GPA0 and GNA0. Module 200, also known as binary predriver, includes terminals OUTP, OUTN, INA and EN as well as terminals labeled P_2, P_3, P_4, P_5, P_6, P_7 and P_8 and N_2, N_3, N_4, N_5, N_6, N_7 and N_8. Module 300, also known as tristate predriver, includes terminals OUTN, INA and terminals labeled P_2, P_3, P_4, P_5, P_6, P_7 and P_8 and N_2, N_3, N_4, N_5, N_6, N_7 and N_8.

As previously noted with regard to the description of FIGS. 2A and 2B, the voltage levels and output resistance of the driver is established by the resistive divider network of the output driver section. Edge rate compensation is achieved by the binary predriver and controlled transitions to and from tristate are achieved by the tristate predriver. Edge rate refers to the rate of change of an output voltage and is measured in volts per unit of time.

Figures 1, 4A:
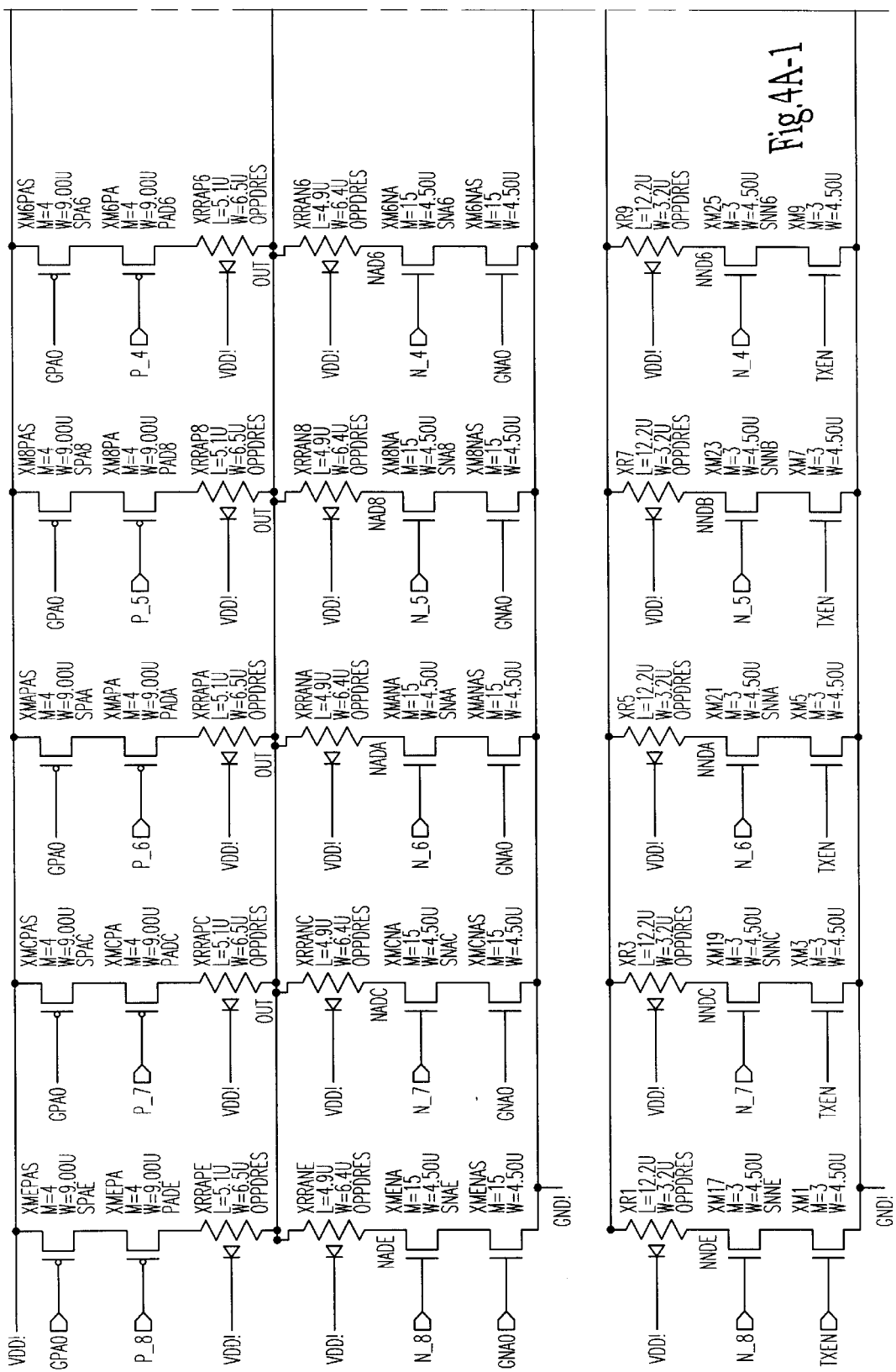
FIG. 4A is a schematic illustrating generally an output section of one embodiment of the present system.
Figures 2, 4A:
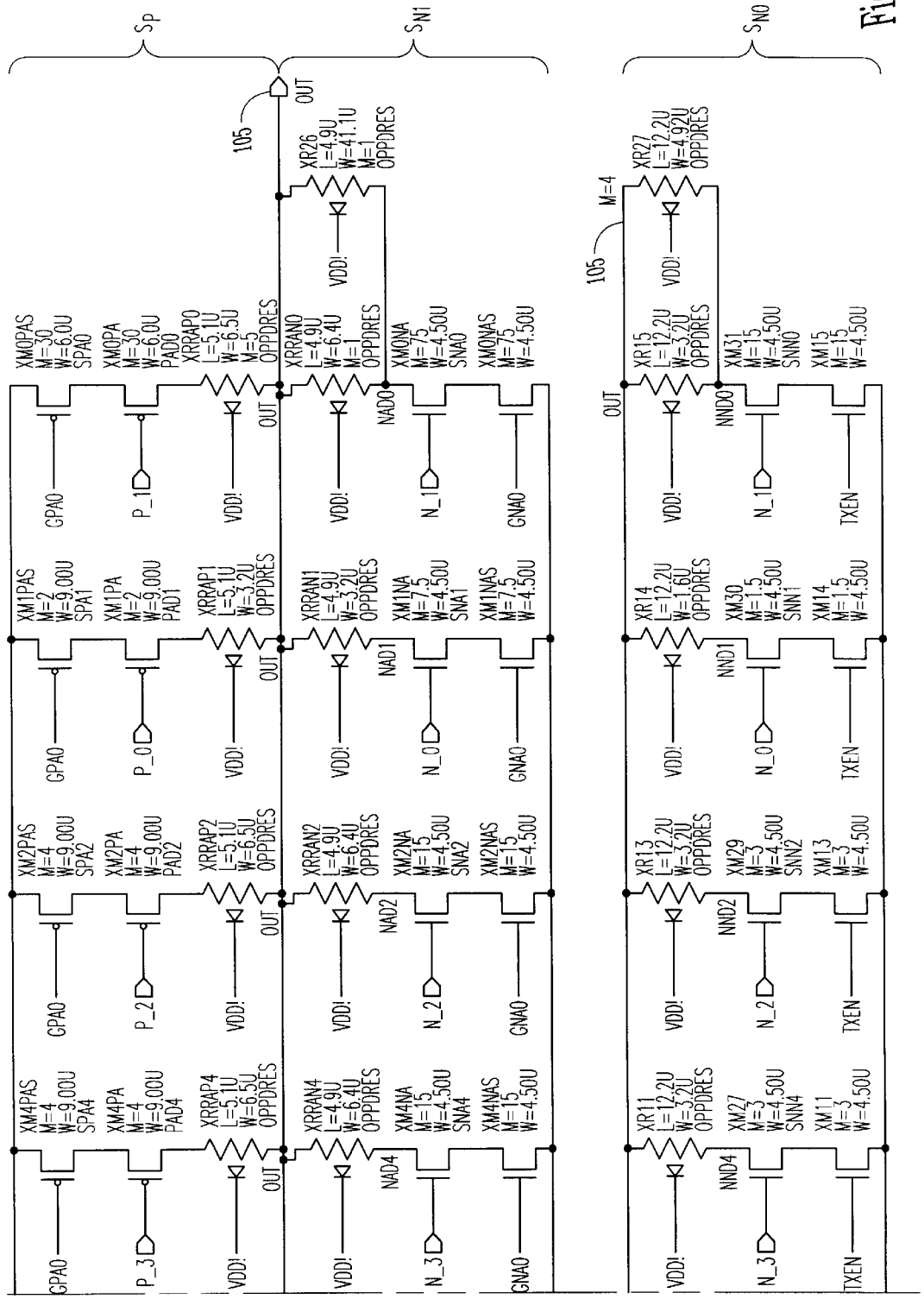

FIG. 4A illustrates a schematic representation of one embodiment of module 100. Three regions, denoted by brackets labeled $S_P$, $S_{N1}$, and $S_{N0}$, correspond to PFET 80, NFET 90 and NFET 85, respectively, of FIG. 2B. As described with respect to FIG. 2B, each of PFET 80, NFET 85 and NFET 90 is coupled to an output node and in FIG. 4A, the output node is marked 105. Each of the three regions includes a plurality of parallel legs, with each leg having at least one transistor. In the embodiment shown in FIG. 4A, each region includes nine legs, however, more or less legs are also contemplated.

The multiple legs associated with region $S_P$, $S_{N1}$, and $S_{N0}$ permit precise control of driver 50. In the embodiment shown, the transistors coupled to nodes P_0, P_1, P_2, P_3, P_4, P_5, P_6, P_7 and P_8, each referred to herein as P-bits, correspond to the single PFET 80 modeled in FIG. 2B. In the embodiment shown, a first set of transistors coupled to nodes N_0, N_1, N_2, N_3, N_4, N_5, N_6, N_7 and N_8, each referred to herein as N-bits, corresponds to the single NFET 85 modeled in FIG. 2B and a second set of transistors coupled to the N-bits corresponds to the single NFET 90, also modeled in FIG. 2B. Nodes P_0 and N_0 are each referred to herein as a half bit. Nodes P_1 and N_1 are each referred to herein as a base bit. Nodes P_2 through P_8 and nodes N_2 through N_8 are each referred to herein as a full bit.

Figure 4B:
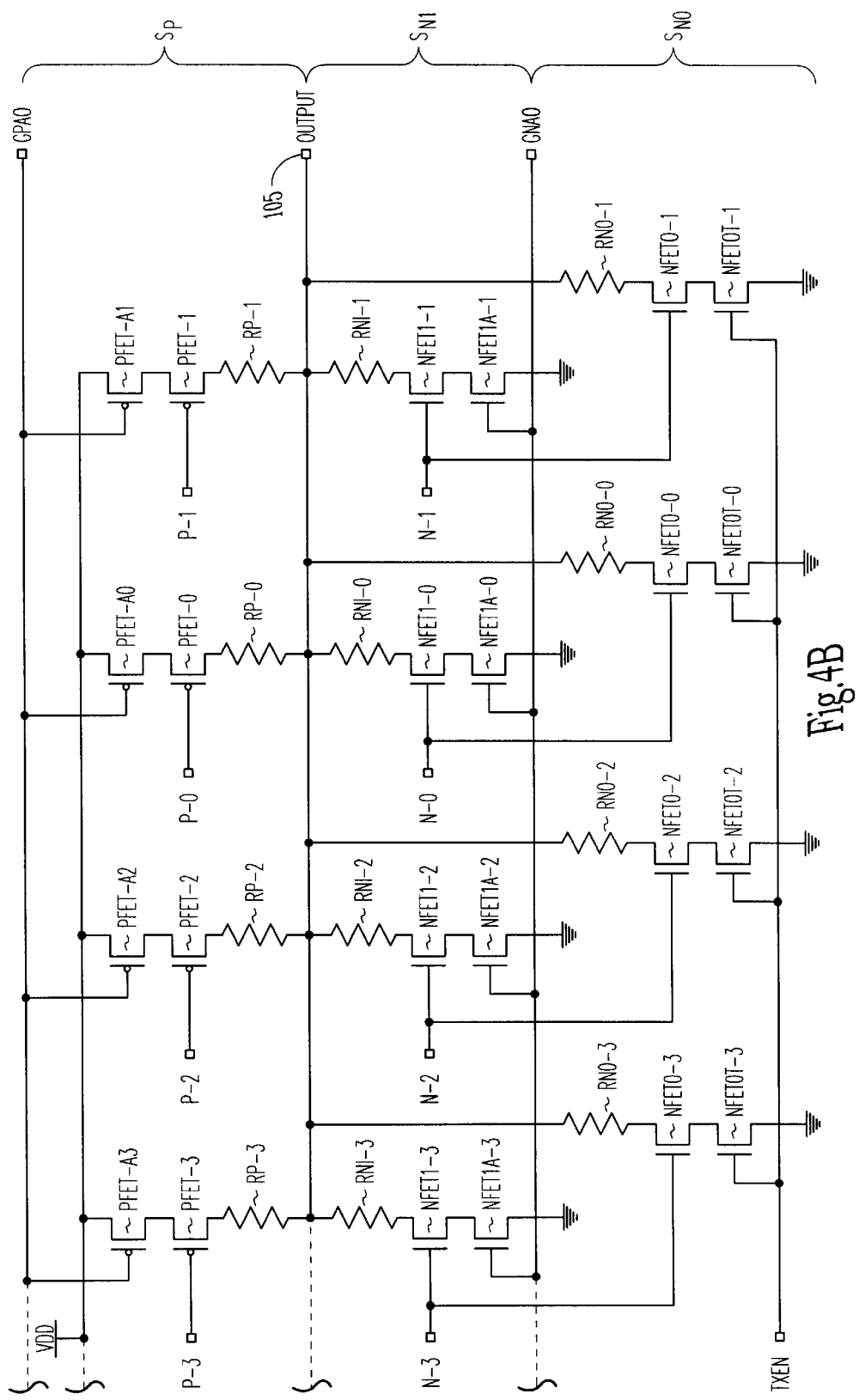
FIG. 4B is a portion of a schematic illustrating generally a portion of an output section of one embodiment of the present system.

FIG. 4B illustrates a portion of the schematic of FIG. 4A. Focusing first on region $S_P$, it will be noted that the gate of PFET-1, PFET-0, PFET-2, and PFET-3 is coupled to node P_1, P_0, P_2 and P_3, respectively. Resistors RP-1, RP-0, RP-2 and RP-3 are each coupled between the drains of PFET-1, PFET-0, PFET-2, and PFET-3, respectively, and output 105. The sources of each of PFET-1, PFET-0, PFET-2, and PFET-3 is coupled to the drain of PFET-A1, PFET-A0, PFET-A2, and PFET-A3, respectively. The source of each of PFET-A1, PFET-A0, PFET-A2, and PFET-A3 is coupled to $V_{DD}$ and the gate of each is coupled to terminal GPA0. It will be appreciated that for each leg, the elements are connected in series and thus, the order of connection of each element is unimportant.

Focusing on region $S_{N1}$, it will be noted that the gate of NFET1-1, NFET1-0, NFET1-2, and NFET1-3 are each coupled to node N_1, N_0, N_2 and N_3, respectively. Resistors RN1-1, RN1-0, RN1-2 and RN1-3 are each coupled between the drains of NFET1-1, NFET1-0, NFET1-2, and NFET1-3, respectively, and output 105. The sources of each of NFET1-1, NFET1-0, NFET1-2, and NFET1-3 is coupled to the drain of NFET1A-1, NFET1A-0, NFET1A-2, and NFET1A-3, respectively. The source of each of NFET1A-1, NFET1A-0, NFET1A-2, and NFET1A-3 is coupled to ground and the gate of each is coupled to terminal GNA0. It will be appreciated that for each leg, the elements are connected in series and thus, the order of connection of each element is unimportant.

Focusing on region $S_{N0}$, it will be noted that the gate of NFET0-1, NFET0-0, NFET0-2, and NFET0-3 are each also coupled to node N_1, N_0, N_2 and N_3, respectively. Resistors RN0-1, RN0-0, RN0-2 and RN0-3 are each coupled between the drains of NFET0-1, NFET0-0, NFET0-2, and NFET0-3, respectively, and output 105. The sources of each of NFET0-1, NFET0-0, NFET0-2, and NFET0-3 is coupled to the drain of NFET0T-1, NFET0T-0, NFET0T-2, and NFET0T-3, respectively. The source of each of NFET0T-1, NFET0T-0, NFET0T-2, and NFET0T-3 is coupled to ground and the gate of each is coupled to terminal TXEN. It will be appreciated that for each leg, the elements are connected in series and thus, the order of connection of each element is unimportant.

It will be appreciated that FIG. 4B illustrates a portion of the circuitry associated with P-bits 0 through 3 and N-bits 0 through 3 and that similar additional circuitry is associated with P-bits 4 through 8 and N-bits 4 through 8.

In the embodiment shown in FIG. 4A, the number of transistors corresponding to each schematically represented transistor is a function of the M value appearing adjacent to each transistor. For example, in the base bit, the NFET in $S_{N1}$ controlled by N_1 is marked M=75, whereas the NFET in $S_{N0}$, also controlled by N_1, is marked M=15. In the embodiment of FIG. 4A, the transistors of $S_{N1}$ are five times more numerous than the transistors of $S_{N0}$. In one embodiment, for every one transistor appearing in the schematic of region $S_{N0}$, there are five transistors in the corresponding portions of region $S_{N1}$. The on resistance of each transistor of $S_{N1}$ is one fifth that of each transistor in $S_{N0}$.

In one embodiment, the transistors in the half bit leg are each of a dimension substantially equal to half that of a full bit. In one embodiment, the base bit corresponds to the largest transistors and is selected for providing a close approximation to the targeted performance, that is, in the best case process, voltage and temperature (PVT) wherein the resistance is at a minimum. The balance of the full bits and the half bit are used for fine tuning of performance. In one embodiment, external control circuitry is employed to selectively toggle the half bit leg to test circuit performance and determine if a full bit should be added to the selection of programmed bits or if a full bit should be omitted from the current selection of programmed bits. Such toggling of the half bit leg enables a closer approximation to optimal performance and yet avoids the need for additional full bits and associated complexity.

In one embodiment, the on resistance of the transistors in region $S_P$ is targeted to be 35 ohms and the selectable range of values is nominally 30 to 40 ohms. In one embodiment, the base bit transistors are always in an on condition. Consequently, if the manufacturing process yields a device with best case performance and the temperature was optimal, then only the base bit transistors would be in the on condition. Where the best case is not realizable, additional legs of the output driver section are selectable and thus, switched on. When the appropriate number of legs are selected, the output voltage levels and output resistance remains substantially constant. As a practical matter, typical manufacturing tolerances and performance variations call for approximately half of the programmable bits, or legs, to be selected in order to maintain a suitable match with a particular transmission line. In addition, the programmable bits enables variation of the output resistance to more closely approximate the impedance of the transmission line.

In one embodiment, each leg includes a series resistor to improve the linearity of the device resistance. It is believed that variability in the fabrication process of an FET results in variability in performance of the FET. On the other hand, the fabrication of resistors is fairly predictable. Consequently, an implanted resistance is placed in series with an FET to yield a more controllable device and thus, reduce the need for variations in the programming bits. In the embodiment of FIG. 4B, examples of such resistors include those denoted as RP-1, RN1-1 and RN0-1.

It will be appreciated that the P-bits are selectable independent of the N-bits. Furthermore, the N-bits coupled to region $S_{N0}$ are also applied to region $S_{N1}$, and thus, the same programmable N-bits controls both $S_{N0}$ and $S_{N1}$. Environmental and process changes affecting the transistors in region $S_{N0}$ and will also affect those transistors in $S_{N1}$ and thus, the commonly programmable N-bits is effective.

Figure 5:
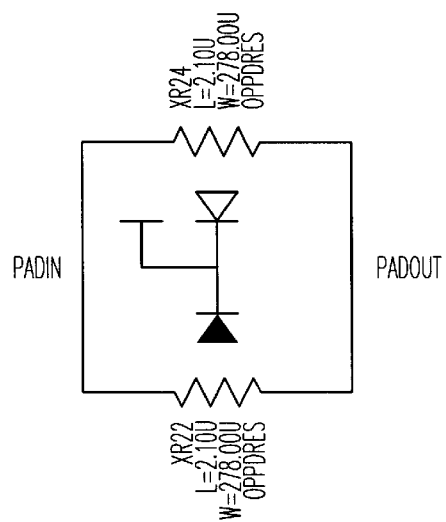
FIG. 5 illustrates a portion of one embodiment of the present system.

In one embodiment, the circuit of FIG. 5 is placed between the package pin and the output of the driver. The circuit of FIG. 5 illustrates a programmable resistance to enable matching of the load resistance with the output of the driver resistance. The circuit of FIG. 5 provides half ohm granularity. PADIN is coupled to output 105 of FIG. 4B and PADOUT is coupled to a package pin accessible from the exterior of the driver.

Compensation for variations in process, voltage and temperature is managed by means of the programmable P-bits and N-bits. Without compensation, variations in manufactured components may yield driver circuits that overshoot or undershoot targeted performance. In some cases, undesirable ringing, degradation of noise margins, and deterioration of skew rate may result.

Control of the edge rate of the driver is achieved by means of a predriver. In one embodiment, a binary predriver and a tristate predriver provide a relatively uniform edge rate. In one embodiment, the P-bits and N-bits used for controlling the output driver section also provide compensation of the edge rate.

In one embodiment, the output driver section presents an asymmetrical impedance. In one embodiment, the N pull down region has a nominal resistance of 7 ohms and the P pull up region has a nominal resistance of 35 ohms, the ratio of which is approximately 5 to 1. Since the NFET is small compared to the PFET, the NFET is likely to overwhelm the PFET. Despite the asymmetry of impedance, a uniform rate of rising edge and falling edge is sought.

In one embodiment, the operational protocol provides that the output is driven to a logical "1" state, followed by a switch off which leaves the output in a high impedance mode, or tristate condition. In one embodiment, the propagation delay generated by the binary predriver matches that of the propagation delay generated by the tristate predriver. Matching propagation delays operates to reduce any race condition sensitivity.

The binary predriver is illustrated in FIG. 3 as module 200. Terminal INA receives the input signal to predriver 200. Programmable P-bits and N-bits of binary predriver 200 are in common with those of output driver section 100. Terminals OUTP and OUTN are coupled to GPA0 and GNA0, respectively, of output driver section 100.

Figures 1, 6:
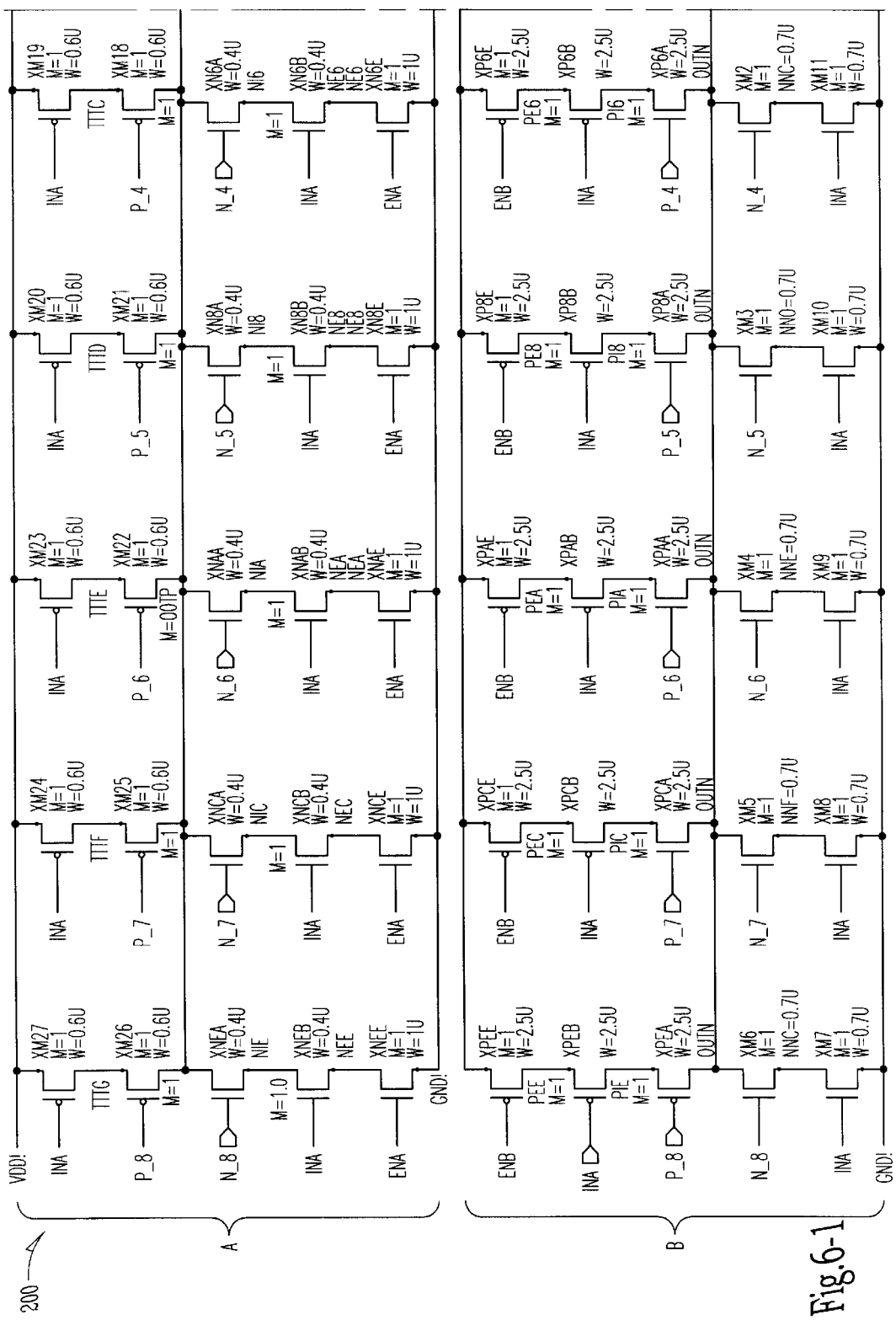
FIG. 6 is a schematic illustrating generally a predriver portion of one embodiment of the present system.
Figures 2, 6:
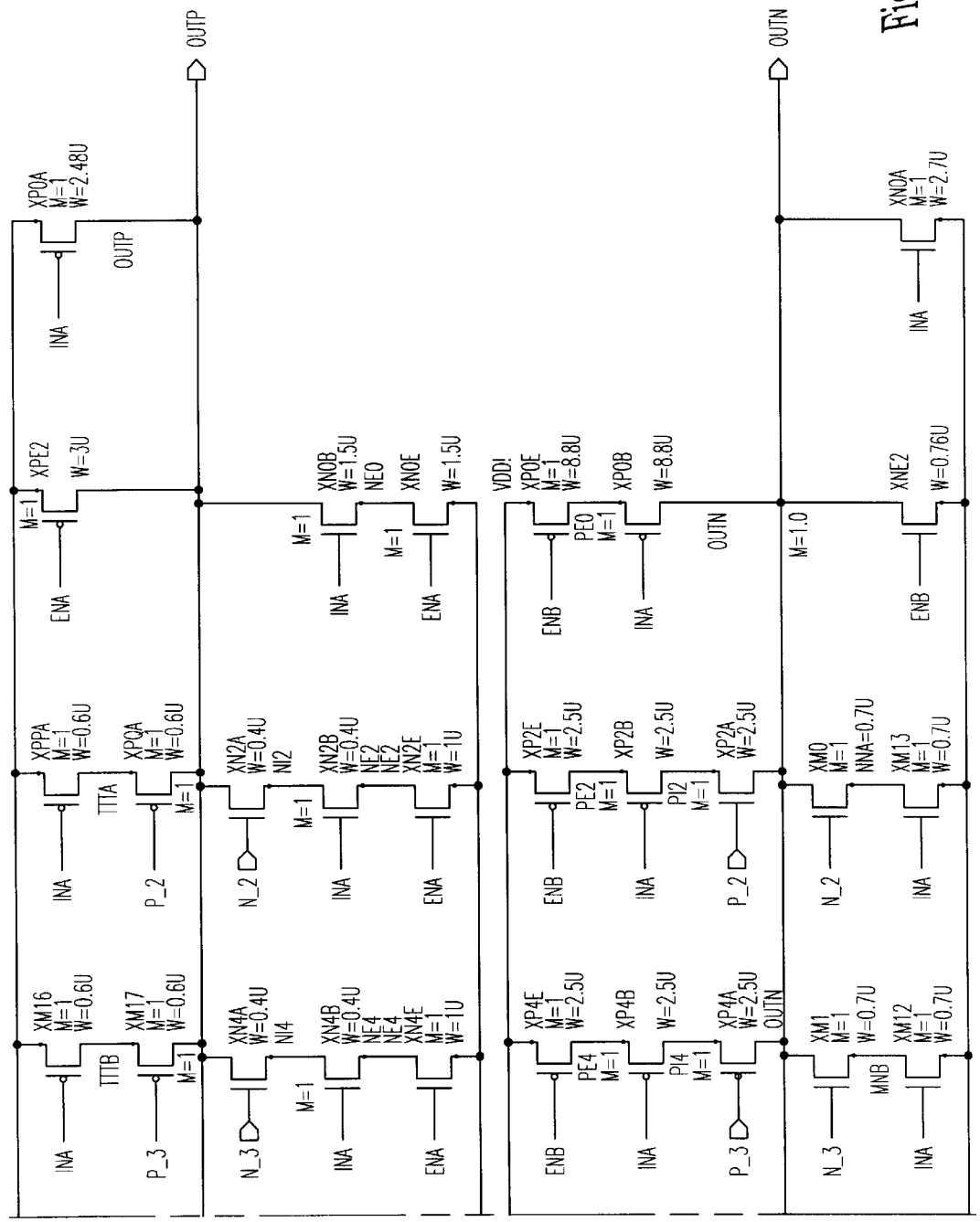

FIG. 6 illustrates schematically a portion of the binary predriver 200. Terminal OUTP independently controls the PFETs of $S_P$ in the output driver section. Terminal OUTN independently controls the NFETs of $S_{N1}$ in the output driver section. Terminals ENA and ENB are coupled by an inverter and thus region A and region B of FIG. 6 are activated, or deactivated, concurrently.

Typically, drivers are fabricated with symmetrical output resistance and the concern for edge rate control is limited to switching the PFET to an on condition or the NFET to an on condition. In the present system, the NFET resistance is substantially lower than that of the PFET resistance, and thus there is concern for both the rising and falling edges, that is, turning on and turning off, of the OUTP signal in the binary predriver. In addition, it is desirable to control both the falling edge and the rising edge of the output driver stage.

In one embodiment of binary predriver 200, the base bit and the half bit are omitted. In one embodiment of tristate predriver 300, the base bit and the half bit are omitted. In one embodiment, the number of programmable bits in the predriver section are greater than, equal to, or less than the number of programmable bits in output driver section 100. In one embodiment, the programmable bits in the predriver section are electrically independent of the programmable bits in the output driver section.

In the embodiment of FIG. 6, seven programmable bits in the predriver are illustrated, namely P_2 through P_8 and N_2 through N_8. The bit corresponding to the base bit remains in an on condition except during a test mode when the base bit is switched off. The test mode enables a zero current state. In one embodiment, a half bit is toggled to determine if an additional full bit yields improved performance or if removal of a full bit yields improved performance. In one embodiment, the half bit is omitted. In one embodiment, the input data determines whether the edge is falling or rising and selects the base bit accordingly. As shown in FIG. 6, one embodiment uses N-bits to control the falling edge rate and P-bits to control the rising edge rate on the NFETs.

The present system enables control of the edge rate of turning on and turning off of both the predriver and the output driver section. Without such control, a rapid rising edge is likely to overshoot and ring. Excessive ringing delays the time after which a reliable signal can be sensed. A slow rising edge also postpones the time after which a reliable signal can be sensed. Faster clock speeds are possible when the edge rate is consistent. In addition, instantaneous power requirements are dampened with uniform edge rates. Uniform power requirements allows for simplified power supply circuitry.

Figures 1, 7:
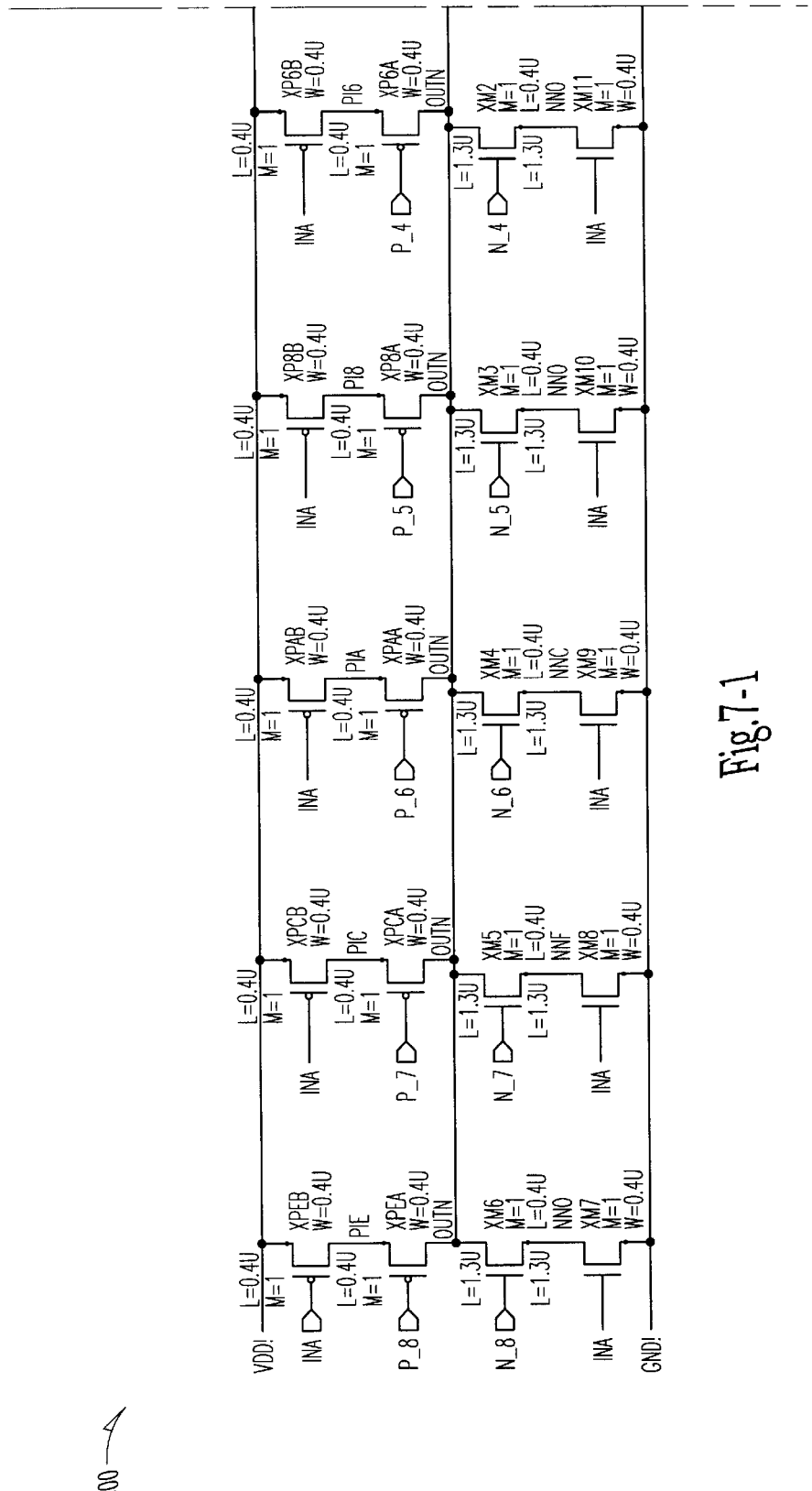
FIG. 7 is a schematic illustrating generally a predriver portion of one embodiment of the present system.
Figures 2, 7:
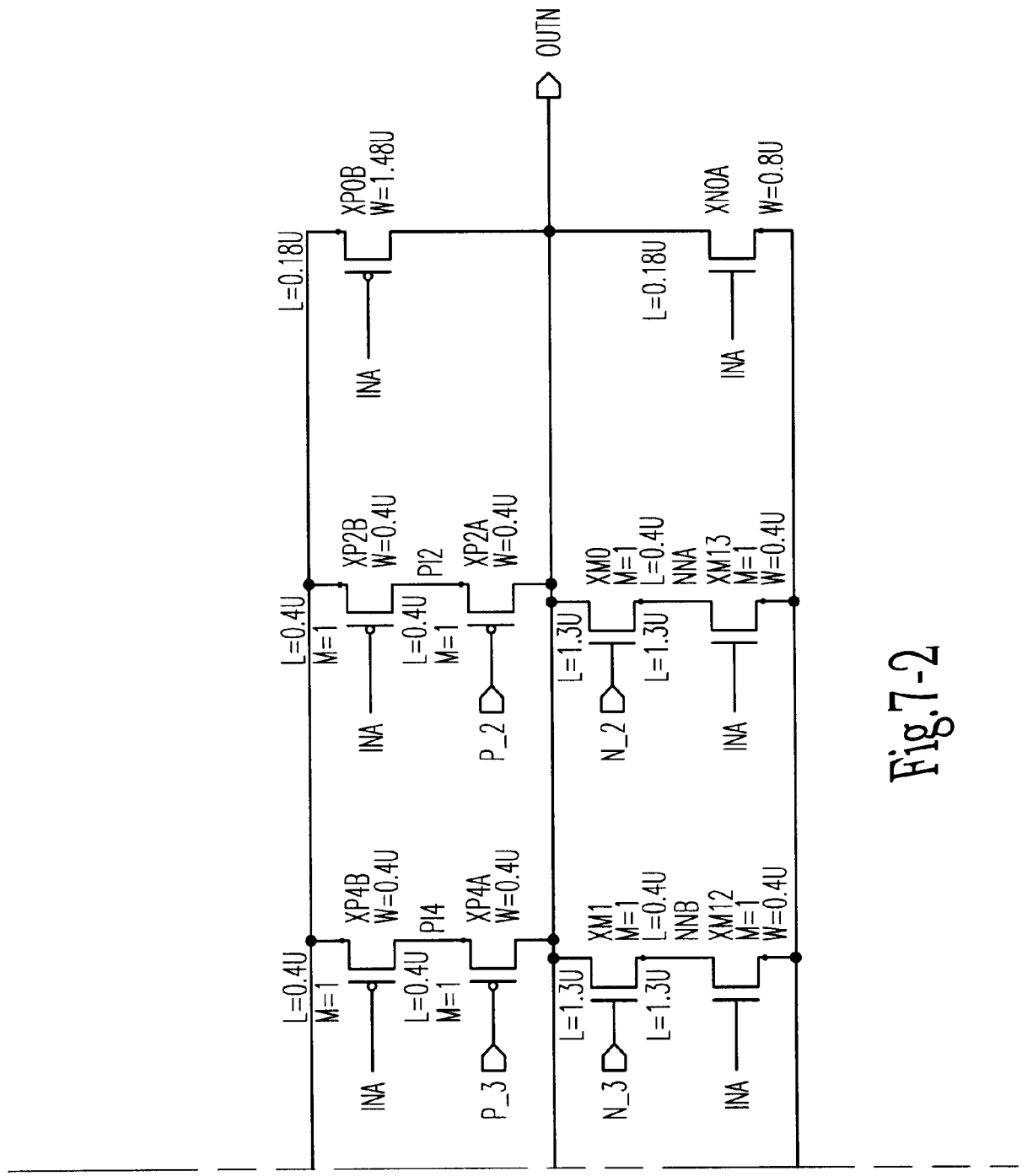

A portion of one embodiment of tristate predriver 300 is illustrated in FIG. 7. The output of tristate predriver 300 is denoted OUTN and is coupled to TXEN of output driver section 100. P-bits P_2 through P_8 and N-bits N_2 through N_8 are in common with the previously discussed P-bits and N-bits. In addition, the half bit is omitted and the base bit is replaced with a short. In one embodiment, tristate predriver 300 provides a propagation delay that matches that of binary predriver 200. In one embodiment, tristate predriver 300 may be modeled as a programmable inverter.

Variations in manufacturing process may result in variations in performance of transistors, and thus variations in the performance of circuitry comprising those transistors. For example, the mobility, or gain, of a transistor may be related to the manufacturing process. In addition, the effective length of the polywidth channel between implants may enable electrons to conduct more quickly or slowly, thus resulting in variable circuit performance. Furthermore, the sheet resistance of various layers affects the electron mobility, and thus also vary the performance of the transistor.

Voltage variations also may affect performance of a transistor circuit. A power supply may be weak or strong and thus result in variable performance with changes in power draw.

Variations in temperature may also affect performance of a transistor. For example, ambient temperature changes, power (and thus, heat) dissipation can result in degraded performance. Efficacy of a cooling fan may also affect circuit performance.

Figure 8:
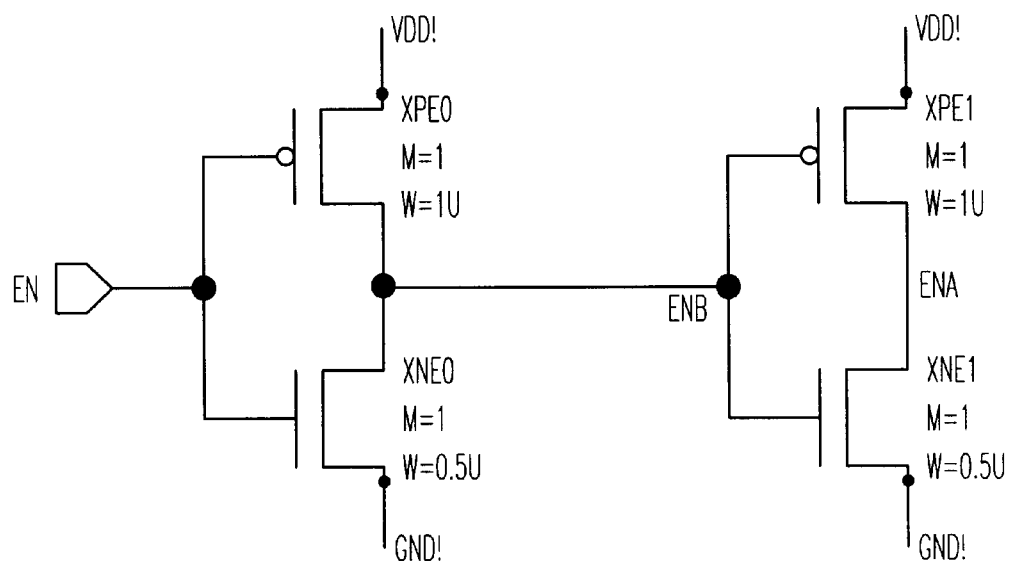
FIG. 8 illustrates a portion of one embodiment of the present system.

FIG. 8 illustrates one embodiment of an inverter circuit that maintains the inverted relationship between terminals ENA and ENB. Inverter circuits with other configurations are also contemplated.

FIG. 9A illustrates performance of an uncompensated driver circuit, such as illustrated in FIG. 1. The illustration depicts voltage as a function of time. $V_{OL}$ and $V_{OH}$ are denoted on the abscissa and the driver output is assumed to be initially at $V_{OL}$, as noted at point 505. A nominal driver, that is one operating at nominal temperature, with nominal voltage supply and having been manufactured to nominal specifications, will and a nominal edge rate as denoted by region 520. A typical value for the edge rate may be 1 volt per nanosecond ("V/nS"). The nominal driver may reach the $V_{OH}$ level without overshoot as denoted at 522. Similarly, upon switching to low, the nominal driver proceeds along 524 at a uniform rate and again, without overshoot, may achieve $V_{OL}$ at 526. Soon after transitioning to $V_{OH}$, at 542, the voltage level of the nominal driver can be reliably sensed. In contrast to the nominal driver, a driver operating with best case parameters may display a different signal trace. Again, starting at 505, the best case driver begins at $V_{OL}$ but the output voltage rises at a rate in excess of the nominal driver. At 510, the best case driver may rise at a rate of 3 V/nS. Such a rapid rise may draw peak instantaneous power from the supply and rather than transitioning smoothly to $V_{OH}$, the best case driver may overshoot and oscillate briefly, or ring, until finally settling to a uniform voltage. In fact, the best case driver may settle at a voltage in excess of $V_{OH}$, as depicted at 512. The best case driver transitions to $V_{OL}$ at a rate in exceeding that of the nominal driver, as shown at 514. The best case driver may drop at a rate on the order of 3 V/nS and display ringing before settling to a level approaching $V_{OL}$, as shown at 516. In fact, the best case driver may settle to a voltage below a specified $V_{OL}$. At 542, the best case driver may still be ringing and thus, to reliably sense the level, sensing is postponed until time 540. A worst case driver, that is one operating with suboptimal voltages, worst case fabrication parameters and worst case temperature, may exhibit slow rise performance as denoted at point 530, low $V_{OH}$ as denoted at 532, and slow drop performance as denoted at 534. The worst case driver may settle to a low voltage above a specified $V_{OL}$. Reliable sensing of the worst case driver cannot be accomplished until after time 540. It will be noted that such delays in the reliable sensing of the signal level derived from uncompensated drivers imposes a limitation on the speed of data communication. In addition, rapid transitions in output signals are met with increased instantaneous current which places additional loads on the power supply. It will be appreciated that the noise margins between $V_{OL}$ and $V_{OH}$, are reduced with uncompensated drivers.

FIG. 9B illustrates performance of the compensated driver of the present system. Starting at $V_{OL}$, as shown at 550, the output of the nominal driver, according to the present system, rises at a predetermined rate as denoted by 560. As previously described, and in one embodiment, the edge rate is compensated by the binary predriver 200 and the tristate predriver 300. hn one embodiment, the rising and falling edge rate is typically 1 V/nS. In one embodiment, the output signal rises to $V_{OH}$ without exhibiting signs of ringing and settles at 558. Returning to $V_{OL}$, the nominal driver descends at a uniform edge rate as denoted by 565. A best case driver, according to the present system, also rises and descends at a uniform edge rate, as denoted by 570 and 575. The $V_{OH}$ and $V_{OL}$ of the best case driver is substantially the same as that of the nominal driver, shown herein at 558. The worst case driver also rises and descends at a uniform edge rate, as denoted by 580 and 585. The $V_{OH}$ and $V_{OL}$ of the worst case driver is substantially the same as that of the nominal driver, shown herein at 558. The best case driver, the nominal driver, and the worst case driver uniformly operate with a consistent $V_{OL}$ and $V_{OH}$ and with uniform rising and falling edge rates. The best case driver, the nominal driver, and the worst case driver differ in the speed of transitioning to the different voltage levels. The propagation delays are adjusted automatically because the clock rate in the overall circuit has adjusted accordingly. At time 556, the output of the compensated driver of the present system can be reliably sampled, or sensed.

The noise margins with the compensated driver of the present system are consistently selectable. Consequently, the difference between the $V_{OL}$ and $V_{OH}$ can be reduced for higher data communication rates and lower power requirements and yet sampling reliability can be maintained.

The present system allows for selection of a desired $V_{OL}$ and $V_{OR}$ to meet manufacturing, design, or other specifications. Additional range of variability can also be provided with additional programmable P-bits and N-bits.

FIG. 10 illustrates a model of one embodiment of the present system. In the embodiment shown, the aforementioned P-bits and N-bits are herein denoted as PVTP[8:0] and PVTN[8:0], respectively. PAD and PADN are complementary outputs wherein PAD corresponds to output node 105 of FIG. 4A.

Figure 11:
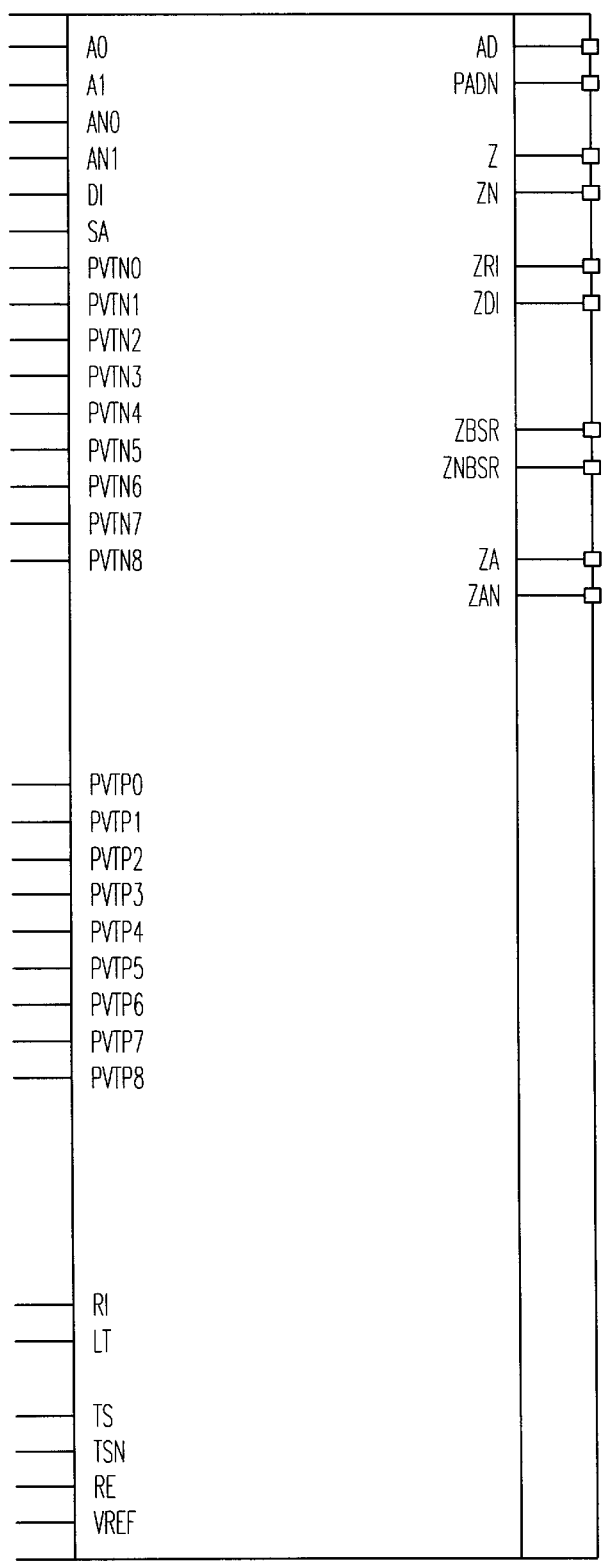
FIG. 11 illustrates a view of one embodiment of the present system.

FIG. 11 illustrates a view of one embodiment of the present system. Terminals PVTP[8:0] and PVTN[8:0] are illustrated as well as PAD and PADN. The labeling of the terminals of FIG. 11 is consistent with that of FIG. 10.

FIG. 12 tabulates a truth table for portions of one embodiment of the present system. In particular, the output node PAD is tabulated for various logical level inputs of terminals identified in FIG. 10, FIG. 11 and elsewhere in this document. In the figure, the abbreviation BC refers to best case, NOM refers to nominal, and WC refers to worst case. PVT refers to the variables process, voltage and temperature.

FIG. 13 tabulates a truth table for output node PADN of one embodiment of the present system.

FIG. 14 tabulates propagation delays for a portion of one embodiment of the present system.

Figure 15:
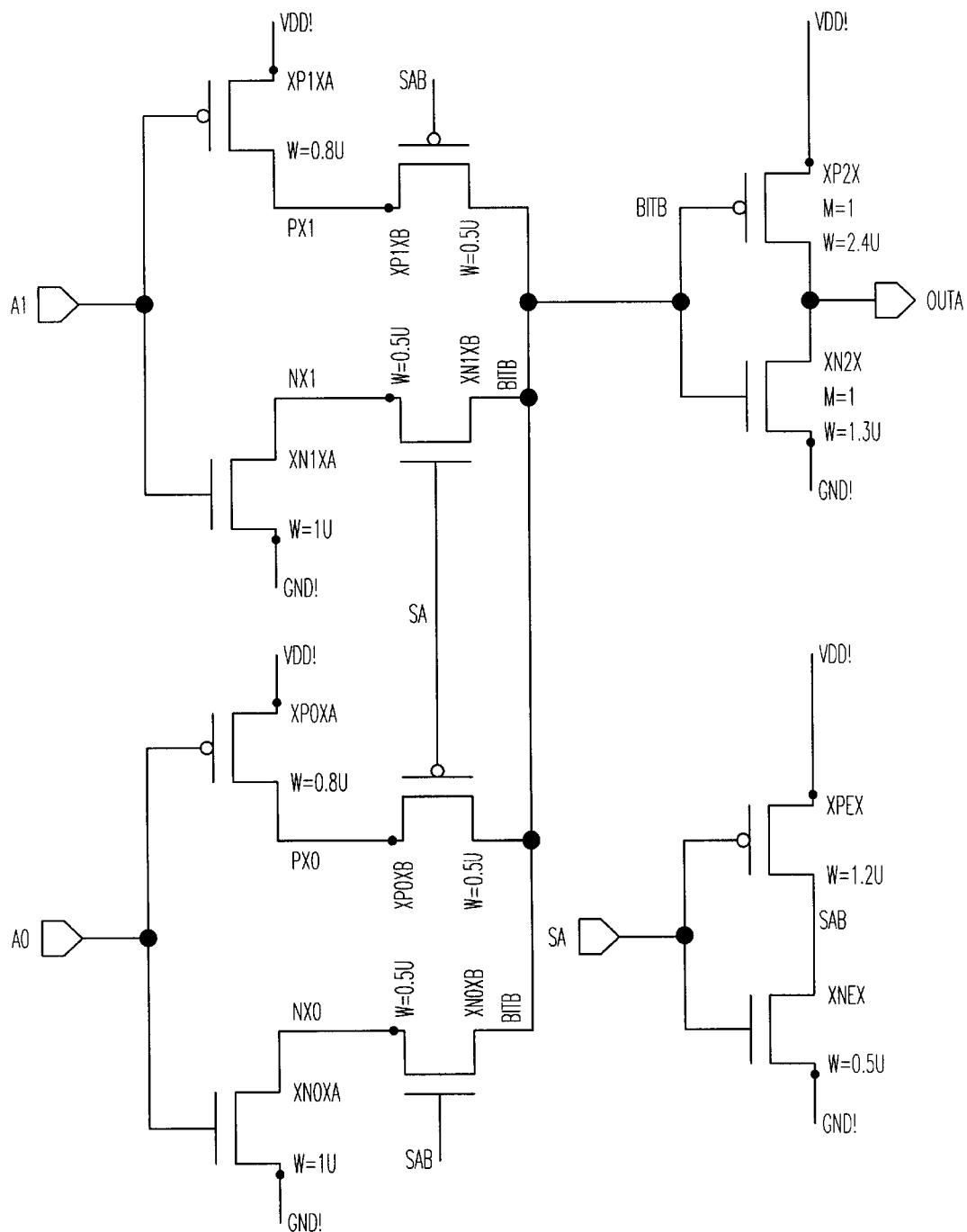
FIG. 15 illustrates a portion of one embodiment of test circuitry for the present system.

FIG. 15 illustrates a schematic for the input of one embodiment of the present system. A1, A0 and SA represent nodes corresponding to nodes appearing in FIG. 10. Node A1 and A0 are input nodes to a multiplexer and SA is an input select node to enable selection of node A1 or node A0. Node OUTA couples to the input of the driver as described above. In one embodiment, node A0 is used for data input and node A1 is used for purposes of testing the circuitry. In one embodiment, the multiplexer of FIG. 15 is located in close proximity to the driver and thus, any external test circuitry coupled to the test node will have little effect on the driver when the other, or functional, node is selected. Such a configuration eliminates undesirable loading effects while permitting a boundary scan mode to verify interconnections within the driver.

CONCLUSION

Although specific embodiments have been illustrated and described herein, it will be appreciated by those of ordinary skill in the art that any arrangement which is calculated to achieve the same purpose may be substituted for the specific embodiment shown. For example, rather than FET technology, the present system may be implemented in bipolar, BiCMOS, gallium arsenide, silicon on insulator, or other technology. This application is intended to cover any adaptations or variations of the present invention.

What is claimed is:

1. An integrated circuit driver comprising:
    an output node for coupling to a load and providing a first voltage level at a predetermined impedance, the first voltage level corresponding to a logic high level, and providing a second voltage level at the predetermined impedance, the second voltage level corresponding to a logic low level, and presenting a high impedance state;
    a first switched resistive element coupled to the output node and also coupled to a first voltage source;
    a second switched resistive element coupled to the output node and also coupled to a ground potential;
    a third switched resistive element coupled to the output node and also coupled to the ground potential;
    a first control line coupled to the first switched resistive element, the first control line for actuating the first switched resistive element;
    a second control line coupled to the second switched resistive element, the second control line for actuating the second switched resistive element;
    a third control line coupled to the third switched resistive element, the third control line for actuating the third switched resistive element; and
    a predriver having a first node coupled to the first control line and a second node coupled to the second control line, the predriver adapted to provide a predetermined edge rate; and
    wherein the load is a resistive load coupled to a third voltage source and wherein the first voltage level, the second voltage level and the predetermined impedance remain substantially constant with variations in manufacturing process, variations in the first voltage source and variations in operating temperature.

2. The integrated circuit driver of claim 1 wherein the first switched resistive element comprises a PFET.

3. The integrated circuit driver of claim 1 wherein the second switched resistive element comprises an NFET.

4. The integrated circuit driver of claim 1 wherein the third switched resistive element comprises an NFET.

5. The integrated circuit driver of claim 1 wherein the ratio of the resistance of the second switched resistive element to the resistance of the third switched resistive element is approximately five to one.

6. The integrated circuit driver of claim 1 wherein the first voltage source is approximately 1.8 volts.

7. A driver comprising:
    an output section, including:
        an output node;
        a plurality of P-nodes;
        a first plurality of P-channel transistors, each P-channel transistor of the first plurality of P-channel transistors having a source coupled to a supply voltage and a drain coupled to the output node, wherein each of the plurality of P-nodes is coupled to a gate of each P-channel transistor of the first plurality of P-channel transistors;
        a plurality of N-nodes;
        a first plurality of N-channel transistors, each N-channel transistor of the first plurality of N-channel transistors having a drain coupled to the output node and a source coupled to a ground potential relative to the supply voltage wherein each of the plurality of N-nodes is coupled to a gate of each N-channel transistor of the first plurality of N-channel transistors; and a second plurality of N-channel transistors, each N-channel transistor of the second plurality of N-channel transistors having a drain coupled to the output node and a source coupled to the ground potential wherein each of the plurality of N-nodes is coupled to a gate of each N-channel transistor of the second plurality of N-channel transistors; and a first predriver section including:

a P-output node;

a second plurality of P-channel transistors, each P-channel transistor of the second plurality of P-channel transistors having a source coupled to the supply voltage and a drain coupled to the P-output node, wherein each of the plurality of P-nodes is coupled to a gate of each P-channel transistor of the second plurality of P-channel transistors;

a third plurality of N-channel transistors, each N-channel transistor of the third plurality of N-channel transistors having a drain coupled to the P-output node and a source coupled to the ground potential and wherein each of the plurality of N-nodes is coupled to a gate of each N-channel transistor of the third plurality of N-channel transistors;

an N-output node;

a third plurality of P-channel transistors, each P-channel transistor of the third plurality of P-channel transistors having a source coupled to the supply voltage and a drain coupled to the N-output node, wherein each of the plurality of P-nodes is coupled to a gate of each P-channel transistor of the third plurality of P-channel transistors; and a fourth plurality of N-channel transistors, each N-channel transistor of the fourth plurality of N-channel transistors having a drain coupled to the N-output node and a source coupled to the ground potential and wherein each of the plurality of N-nodes is coupled to a gate of each N-channel transistor of the fourth plurality of N-channel transistors; and wherein the P-output node is coupled to the source of each P-channel transistor of the first plurality of P-channel transistors and further wherein the N-output node is coupled to the source of each N-channel transistor of the first plurality of N-channel transistors; and a second predriver section including:

a T-node;

a fourth plurality of P-channel transistors, each P-channel transistor of the fourth plurality of P-channel transistors having a source coupled to the supply voltage and a drain coupled to the T-node, wherein each of the plurality of P-nodes is coupled to a gate of each P-channel transistor of the fourth plurality of P-channel transistors; and a fifth plurality of N-channel transistors, each N-channel transistor of the fifth plurality of N-channel transistors having a drain coupled to the T-node and a source coupled to the ground potential and wherein each of the plurality of N-nodes is coupled to a gate of each N-channel transistor of the fifth plurality of N-channel transistors; and wherein the T-node is coupled to the source of each of the second plurality of N-channel transistors of the output section.

8. The driver of claim 7 wherein the P-channel transistors are PFET transistors and wherein the N-channel transistors are NFET transistors.

9. The driver of claim 7 wherein the first plurality of P-channel transistors comprises one P-channel transistor having an effective resistance lower than an effective resistance of each of the other P-channel transistors in the first plurality of P-channel transistors.

10. The driver of claim 7 wherein the first plurality of N-channel transistors comprises one N-channel transistor having an effective resistance lower than an effective resistance of each of the other N-channel transistors in the first plurality of N-channel transistors.

11. The driver of claim 7 wherein the second plurality of N-channel transistors comprises one N-channel transistor having an effective resistance lower than an effective resistance of each of the other N-channel transistors in the second plurality of N-channel transistors.

12. The driver of claim 7 wherein the ratio of the effective resistance of the second plurality of N-channel transistors to the effective resistance of the first plurality of N-channel transistors is approximately five to one.

13. A circuit comprising:

an output node adapted to provide two or more signal levels to a resistive load;

a first switched resistive element coupled to the output node and also coupled to a first voltage source;

a second switched resistive element coupled to the output node and also coupled to a ground potential, the second switched resistive element selectable independent of the first switched resistive element;

a third switched resistive element coupled to the output node and also coupled to the ground potential, the third switched resistive element selectable independent of the first switched resistive element and selectable independent of the second switched resistive element;

a predriver having a first node coupled to the first switched resistive element and a second node coupled to the second switched resistive element, the predriver adapted to provide a predetermined edge rate; and wherein each of the two or more signal levels include a signal voltage at a predetermined impedance wherein the signal voltage and predetermined impedance remain substantially constant with variations in manufacturing process, first voltage source and a temperature.

14. The circuit of claim 13 wherein the first switched resistive element includes a transistor.

15. The circuit of claim 13 wherein the second switched resistive element includes a transistor.

16. The circuit of claim 13 wherein the third switched resistive element includes a transistor.

17. The circuit of claim 13 wherein a ratio of the resistance of the second switched resistive element to a resistance of the third switched resistive element is approximately five to one.

18. A circuit comprising:

an output means for providing an output signal to a resistive load;

a first switch means for selectively coupling a first resistor to the output means and a first voltage source;

a second switch means for selectively coupling a second resistor to the output means and a second voltage source;

a third switch means for selectively coupling a third resistor to the output means and the second voltage source; and a predriver coupled to the first switch means and the second switch means and adapted to provide a predetermined edge rate; and wherein the first switch means, the second switch means and the third switch means are each independently operable.

19. The circuit of claim 18 wherein a ratio of the second resistor to the third resistor is approximately five to one.

20. The circuit of claim 18 wherein the second switch means includes a transistor.

21. The circuit of claim 18 wherein the third switch means includes a transistor.

* * * * *